US010777700B2

(12) United States Patent
Ma et al.

(10) Patent No.: US 10,777,700 B2
(45) Date of Patent: Sep. 15, 2020

(54) OPTOELECTRONIC DEVICES BASED ON THIN SINGLE-CRYSTALLINE SEMICONDUCTOR FILMS AND NON-EPITAXIAL OPTICAL CAVITIES

(71) Applicants: Wisconsin Alumni Research Foundation, Madison, WI (US); The Research Foundation for the State University of New York, Amherst, NY (US)

(72) Inventors: Zhenqiang Ma, Middleton, WI (US); Zhenyang Xia, Madison, WI (US); Qiaoqiang Gan, Buffalo, NY (US); Haomin Song, Buffalo, NY (US); Zongfu Yu, Madison, WI (US); Ming Zhou, Middleton, WI (US)

(73) Assignees: Wisconsin Alumni Research Foundation, Madison, WI (US); The Research Foundation for the State University of New York, Amherst, NY (US)

( * ) Notice: Subject to any disclaimer, the term of this patent is extended or adjusted under 35 U.S.C. 154(b) by 620 days.

(21) Appl. No.: 15/612,187

(22) Filed: Jun. 2, 2017

(65) Prior Publication Data
US 2018/0351024 A1    Dec. 6, 2018

(51) Int. Cl.
*H01L 31/11* (2006.01)
*G01J 3/28* (2006.01)
(Continued)

(52) U.S. Cl.
CPC ........ *H01L 31/1136* (2013.01); *G01J 1/0209* (2013.01); *G01J 1/0488* (2013.01); *G01J 1/42* (2013.01); *G01J 3/0259* (2013.01); *G01J 3/2803* (2013.01); *G01J 3/42* (2013.01); *H01L 27/1443* (2013.01); *H01L 31/028* (2013.01); *H01L 31/0296* (2013.01);
(Continued)

(58) Field of Classification Search
CPC .. H01L 31/1136; H01L 31/113; H01L 31/112; H01L 31/095; H01L 31/09; H01L 31/02327; H01L 31/028; H01L 31/0296; H01L 31/0304; H01L 31/032; H01L 31/1808; H01L 27/1443; G01J 1/0209; G01J 1/0488; G01J 1/42; G01J 3/0259; G01J 3/2803; G01J 3/42; G01J 2001/0481; G01J 2003/1213
See application file for complete search history.

(56) References Cited

U.S. PATENT DOCUMENTS 5,200,634 A * 4/1993 Tsukada ............ H01L 27/14643
257/291
5,583,338 A   12/1996 Goodwin
(Continued)

OTHER PUBLICATIONS

Liu et al., Semiconductor Nanomembrane-Based Light-Emitting and Photodetecting Devices, Photonics 2016, 3, 40; doi:10.3390/photonics3020040, Jun. 1, 2016, pp. 1-19.
(Continued)

*Primary Examiner* — John R Lee
(74) *Attorney, Agent, or Firm* — Bell & Manning, LLC

(57) ABSTRACT

Optoelectronic devices that use very thin single-crystalline inorganic semiconductor films as phonon-absorbing layers in combination with non-lattice optical cavities are provided.

21 Claims, 20 Drawing Sheets

(51) Int. Cl.

| | |
|---|---|
| *G01J 3/42* | (2006.01) |
| *H01L 27/144* | (2006.01) |
| *H01L 31/0232* | (2014.01) |
| *H01L 31/028* | (2006.01) |
| *H01L 31/0296* | (2006.01) |
| *H01L 31/0304* | (2006.01) |
| *H01L 31/032* | (2006.01) |
| *H01L 31/113* | (2006.01) |
| *G01J 3/02* | (2006.01) |
| *G01J 1/02* | (2006.01) |
| *G01J 1/42* | (2006.01) |
| *G01J 1/04* | (2006.01) |
| *H01L 31/18* | (2006.01) |
| *G01J 3/12* | (2006.01) |
| *G01J 5/08* | (2006.01) |

(52) U.S. Cl.
CPC ...... *H01L 31/02327* (2013.01); *H01L 31/032* (2013.01); *H01L 31/0304* (2013.01); *H01L 31/1808* (2013.01); *G01J 5/0862* (2013.01); *G01J 2001/0481* (2013.01); *G01J 2003/1213* (2013.01)

(56) References Cited

U.S. PATENT DOCUMENTS

| | | | | |
|---|---|---|---|---|
| 7,812,423 | B2* | 10/2010 | Grawert | G02F 1/3523 257/16 |
| 7,982,296 | B2 | 7/2011 | Nuzzo et al. | |
| 8,232,617 | B2* | 7/2012 | Ma | H01L 27/14603 257/122 |
| 8,895,406 | B2* | 11/2014 | Rogers | B81C 1/0046 438/455 |
| 9,006,785 | B2* | 4/2015 | Ma | H01L 29/66742 257/190 |
| 9,653,640 | B2 | 5/2017 | Ma et al. | |
| 9,711,407 | B2* | 7/2017 | Or-Bach | G06F 17/5072 |
| 2010/0078722 | A1* | 4/2010 | Ma | H01L 21/76254 257/347 |
| 2010/0308429 | A1* | 12/2010 | Ma | H01L 27/14603 257/443 |
| 2012/0211053 | A1* | 8/2012 | Kothari | G02B 5/284 136/246 |
| 2014/0166096 | A1* | 6/2014 | Fogel | H01L 31/0376 136/256 |
| 2014/0217468 | A1* | 8/2014 | Cheng | H01L 29/267 257/192 |
| 2015/0069523 | A1* | 3/2015 | Or-Bach | H01L 24/25 257/390 |
| 2016/0020582 | A1* | 1/2016 | Ma | H01S 5/187 372/50.11 |
| 2017/0104123 | A1* | 4/2017 | Ma | H01L 31/02161 |
| 2017/0200715 | A1* | 7/2017 | Sekar | H01L 27/2436 |
| 2018/0351024 | A1* | 12/2018 | Ma | H01L 31/1136 |
| 2019/0013200 | A1* | 1/2019 | Lagally | H01L 21/02694 |
| 2019/0356114 | A1* | 11/2019 | Ma | H01S 5/3407 |

OTHER PUBLICATIONS

Lopez-Sanchez, Oriol, et al., Ultrasensitive photodetectors based on monolayer MoS2, Nature Nanotechnology 10.1038/NNANO.2013.100, Jun. 9, 2013, pp. 1-6.

Thongrattanasiri, Sukosin, et al., Complete Optical Absorption in Periodically Patterned Graphene, Phys. Rev. Lett. 108.047401, Jan. 27, 2012, pp. 047401-047405.

Cho, Minkyu, et al., Resonant cavity germanium photodetector via stacked single-crystalline nanomembranes, J. Vac. Sci. Technol. B 34(4), May 2, 2016, pp. 040604-1 to 040604-4.

Seo, Jung-Hun, et al., Flexible Phototransistors Based on Single-Crystalline Silicon Nanomembranes, Adv. Optical Mater. 4:1 (Jan. 2016), Oct. 26, 2015, pp. 120-125.

Yang, Hongjun, et al., Transfer Printed Nanomembranes for Heterogeneously Integrated Membrane Photonics, Photonics 2015, 2, Nov. 13, 2015, pp. 1081-1100.

Song, Haomin, et al., Nanocavity Enhancement for Ultra-Thin Film Optical Absorber, Adv. Mater. 26:17 (May 7, 2014), Feb. 24, 2014, pp. 2737-2743.

Kats, Mikhail A., et al., Nanometre optical coatings based on strong interference effects in highly absorbing media, Nature Materials 12.1, Jan. 2013, pp. 20-4.

Xia, Zhenyang, et al., Single-crystalline germanium nanomembrane photodetectors on foreign nanocavities, Science Advances 3:7, Jul. 7, 2017, pp. e1602783.

Wang, Jian, et al., Ge-Photodetectors for Si-Based Optoelectronic Integration, Sensors 11, Jan. 12, 2011, pp. 696-718.

Yi, Soongyu, et al., A multiple-resonator approach for broadband light absorption in a single layer of nanostructured graphene, Optics Express 23:8, Apr. 10, 2015, pp. 10081-10090.

Lee, Kyu-Tae, et al., Colored ultrathin hybrid photovoltaics with high quantum efficiency, Light: Science & Applications 3, Aug. 3, 2014, pp. e215.

Janisch, Corey, et al., MoS2 monolayers on nanocavities: enhancement in light-matter interaction, 2D Materials 3, Apr. 28, 2016, pp. 025017.

Masini, G., et al., Advances in the field of poly-Ge on Si near infrared photodetectors, Materials Science and Engineering B69-70, Jan. 14, 2000, pp. 257-260.

Kats, Mikhail A., et al., Optical absorbers based on strong interference in ultra-thin films, Laser and Photonics Reviews 10:5, Sep. 22, 2016, pp. 699.

* cited by examiner

OPTOELECTRONIC DEVICES BASED ON THIN SINGLE-CRYSTALLINE SEMICONDUCTOR FILMS AND NON-EPITAXIAL OPTICAL CAVITIES

REFERENCE TO GOVERNMENT RIGHTS

This invention was made with government support under FA9550-09-1-0482 awarded by the AFSOR and under DE-NA0002915 awarded by the Department of Energy (DOE). The government has certain rights in the invention.

BACKGROUND

Ultra-thin semiconductors are attractive building blocks for miniaturized optical/optoelectronic devices. To enhance the light matter interaction, thin-film interference in lossy, ultra-thin semiconductor layers has been studied. However, these studies were based on amorphous semiconductors. Consequently, their optoelectronic device performance was limited.

SUMMARY

Optoelectronic devices, such as phototransistors for detecting incident radiation, that use very thin single-crystalline inorganic semiconductor films as phonon-absorbing layers in combination with non-lattice optical cavities are provided.

One embodiment of an optoelectronic device includes an optical cavity comprising a reflector and a dielectric spacer overlying the reflector; and a single-crystalline inorganic semiconductor film having a thickness no greater than 100 nm in contact with the dielectric spacer at a non-epitaxial interface.

One embodiment of a phototransistor includes an optical cavity comprising an electrically conductive reflector and a dielectric spacer overlying the reflector; a single-crystalline inorganic semiconductor film having a thickness no greater than 100 nm in contact with the dielectric spacer at a non-epitaxial interface; a source electrode; and a drain electrode, wherein the source electrode and the drain electrode are in electrical communication with the single-crystalline semiconductor film.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 1A shows a schematic of the fabrication process flow of the Ge nanomembranes on foreign substrates. The lab-made GeOI (panel (i)) was used as the source wafer and the membrane transfer printing method (panels (ii) and (iii)) was then employed to transfer the Ge membrane onto a foreign substrate. Subsequently, a thin down process was adopted to obtain the desired Ge thickness (10~60 nm) (panel (iv)). FIG. 1B shows optical microscope images of ultra-thin Ge films (with thickness of 10~60 nm, from the leftmost panel to the rightmost panel), which have been transfer-printed on $Al_2O_3/Ag/Si$ substrates. The scale bar is 75 μm for all five panels. FIG. 1C depicts triple axis HR-XRD scans of transferred crystalline ultra-thin Ge and evaporated amorphous-Ge films. The thicknesses are both 20 nm. FIG. 1D shows Raman scattering results for the two samples in FIG. 1C. The Raman signal for the transferred Ge membrane shows the typical single peak (300.9 $cm^{-1}$) of single-crystalline Ge materials.

FIG. 2A shows a schematic of an ultra-thin Ge (20 nm) nanomembrane on an optical cavity. FIG. 2B shows the absorption spectra for the structure shown in FIG. 2A. FIG. 2B shows the spatial distribution of the absorption for the structure shown in FIG. 2A. FIG. 2D shows a schematic of traditional epitaxial Ge on a $Si_{0.75}Ge_{0.25}$ buffer layer/Si substrate. The optical constant (n and k) for the $Si_{0.75}Ge_{0.25}$ is obtained from the semiconductor archive website. FIG. 2E depicts the absorption spectrum for the structure shown in FIG. 2D. FIG. 2E depicts the spatial distribution of the absorption for the structure shown in FIG. 2D. The shaded bars in FIGS. 2C and 2F use the same scale for direct comparison.

FIG. 3A shows a schematic of an ultra-thin Ge photodetector on a nanocavity. FIG. 3B shows an optical microscope image of the ultra-thin Ge photodetector. Scale bar: 50 μm. FIG. 3C shows the I-V curves for a p-type Ge photoconductor under dark and illuminated conditions. Inset: The photocurrent shows a linear relationship with the illuminated power. FIG. 3D depicts calculated normalized-photocurrent-to-dark current ratio (NPDR) with the illuminated power, and a comparison with a $MoS_2$ photodetector. FIG. 3E shows the dark current for Ge membranes (single-crystalline Ge films) with different thicknesses. FIG. 3F shows an NPDR comparison between the Ge photodetectors with and without a nanocavity structure (GeOI based).

FIG. 4A shows transfer curves ($V_{GS}$-$I_{DS}$) for the ultra-thin Ge transistor. FIG. 4B shows the photoresponsivity and $V_{DS}$-$I_{DS}$ curves for the ultra-thin Ge phototransistor under the illumination power density of 140.8 $mW/cm^2$. The peak photoresponsivity is 4.7 A/W. FIG. 4C depicts (upper panel) the ultra-thin Ge transistor photocurrent ($|\Delta_{DS}|$) as a function of $V_{GS}$ under various power conditions: 3.36 $mW/cm^2$, 20.8 $mW/cm^2$, 140.8 $mW/cm^2$ and 343.2 $mW/cm^2$, respectively. The lower panel shows the trans-conductance ($|G_m|$) for the ultra-thin Ge transistors. FIG. 4D shows a comparison of the threshold voltage change ($\Delta V_{TH}$) for the ultra-thin Ge phototransistor with that of an epitaxial based III-V phototransistor. The measured $\Delta V_{TH}$ values were obtained by subtracting the threshold voltages extracted from the $V_{GS}$-$I_{DS}$ curves under illuminated and the dark conditions. The solid curve is plotted using the empirical equation for $\Delta V_{TH}$.

FIG. 5A depicts the absorption spectra measured by Fourier Transform Infrared spectroscopy (FTIR) for an ultra-thin Ge sample. The peak wavelength becomes larger as the Ge nanomembrane thickness is changed from 6 to 40 nm. FIG. 5B, left axis: photoresponsivity (A/W) results for three different samples on 220-nm-thick $Al_2O_3$/Ag cavities. The thicknesses of the Ge films are (from top to bottom) 12 nm, 17 nm and 26 nm, respectively. FIG. 5B, right axis: simulated absorption spectra for the four samples. The structure parameters used were the same as those mentioned above. The simulation is based on full-wave Maxwell's equations.

FIG. 7A shows high resolution X-ray Diffraction (XRD) results for the 100 nm germanium/1-μm-thick $SiO_2$/Silicon wafer. FIG. 7B shows Raman scattering result for a fabricated GeOI wafer compared with that of a bulk germanium wafer. The same peak position indicates the GeOI is strain and stress free.

FIG. 8A shows the dark current from a 360 nm thick film. FIG. 8B shows the dark current from a 300 nm thick film. FIG. 8C shows the dark current from a 250 nm thick film. FIG. 8D shows the dark current from a 75 nm thick film. FIGS. 8A-8C show that the dark currents are on the order of milliamperes when the thicknesses of the Ge membranes are on the order of a hundred nanometers. FIG. 8D shows that dark current drops below one milliampere when the thickness is reduced to 75 nm. FIG. 8E shows that dark current decreases to tens to hundreds of microampere when the thickness of the film is 50 nm. FIG. 8F shows that the dark current is on the order of a nanoampere when the thickness of the film is 20 nm.

DETAILED DESCRIPTION

Optoelectronic devices that use very thin single-crystalline inorganic semiconductor films as phonon-absorbing layers in combination with non-lattice optical cavities are provided. The optoelectronic devices include photodetectors, such as phototransistors. By combining thin single-crystalline semiconductor films with optical cavities, the devices are able to enhance light-matter interactions based on a nanocavity interference mechanism, which greatly enhances the weak light absorption by the thin semiconductor films. Additionally, photodetectors incorporating the thin semiconductor films have very low dark currents and, as a result, high photocurrent to dark current ratios.

Figure 1A:
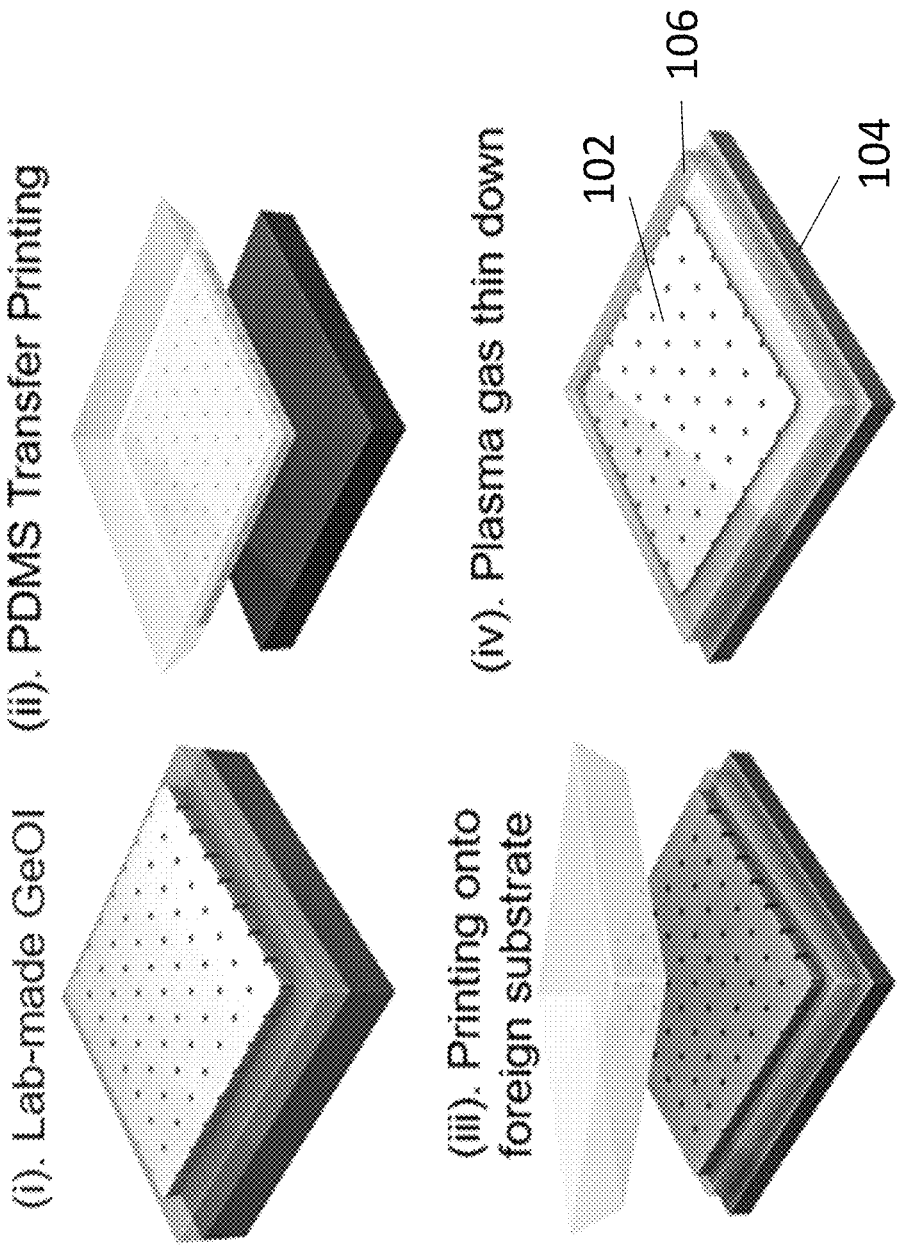
FIGS. 1A-1D depicts fabrication and characterization of ultra-thin Ge nanomembranes on foreign substrates.

The layers in an optoelectronic device are shown schematically in FIG. 1A, panel (iv). The layers include a single-crystalline semiconductor film 102 that serves as a photoactive layer and an underlying optical cavity that includes a reflector 104. Reflector 104 is spaced apart from semiconductor film 102 by an intervening dielectric spacer layer 106. Dielectric spacer layer 106 and semiconductor layer 102 come together at a non-epitaxial interface. As shown in the figure, the optoelectronic device may optionally further include a base substrate supporting the optical cavity.

The single-crystalline semiconductor film is a photoactive material—meaning that it is able to absorb incident radiation and generate a photocurrent. A variety of photoactive semiconductor materials can be used for the single-crystalline semiconductor film, including single element, alloyed, and compound semiconductors of Group IV elements, Group II-VI elements, and Group III-V elements, and perovskites. Examples of semiconductors from which the single-crystalline film can be formed include, Ge, Si, SiGe, GaAs, InP, GaInAs, GaInAsP, GaN, and HgCdTe. Two-dimensional (2D) semiconductors can also be used as the single-crystalline semiconductor. 2D semiconductors are characterized by a two-dimensional bonding geometry in which the atoms are bonded in sheets that are one atomic layer thick. 2D semiconductors include graphene; but also include 2D materials other than graphene. In some embodiments, the 2D semiconductor is a transition metal (for example, a Mo-containing or W-containing) dichalcogenide (for example, S, Se, or Te) (TMDC). These include $MoS_2$; but also includes TMDCs other than $MoS_2$, such as $WS_2$, $MoTe_2$, $MoSe_2$, $WSe_2$, $SnS_2$, $SnSe_2$, and the like. Nanometer thin phosphorus crystalline films, such as black phosphorus, could also be used. Optionally, the semiconductor may be doped to improve or optimize its bandgap. The single-crystalline semiconductor films need not be patterned to achieve the enhanced light absorption; continuous films without patterned holes, or other openings, or patterned islands (e.g., disks) can be used.

The selection of semiconductor material will depend, at least in part, on the desired wavelength range of operation for the optoelectronic device. For example, semiconductors that generate electron-hole pairs upon the absorption of radiation in the ultraviolet, visible, and infrared, including near infrared, regions of the electromagnetic spectrum may be selected. By way of illustration, silicon is photoactive in the UV, visible, and near-infrared regions of the electromagnetic spectrum (e.g., from wavelengths around 200 nm to around 1100 nm) and germanium is photoactive with absorption peaks in the visible and near-infrared regions of the electromagnetic spectrum (e.g., from wavelengths around 600 nm to around 1100 nm).

The absorption spectrum and the photoresponse of the semiconductor thin films vary as a function of the film thickness. Therefore, the desirable thickness of the single-crystalline semiconductor film will depend on the desired optical properties of the optoelectronic device. Generally, the semiconductor films should be thin enough to support single-mode absorption and wavelength selectivity. In addition, because thinner films produce a lower dark current, ultra-thin films are desirable. By way of illustration, some embodiments of the single-crystalline semiconductor films have a thickness of no greater than 100 nm. This includes embodiments of the single-crystalline semiconductor films having a thickness of no greater than 50 nm and further includes embodiments of the single-crystalline semiconductor films having a thickness of no greater than 20 nm. For example, single-crystalline semiconductor films having thicknesses in the range from 5 to 100 nm, including in the range from 5 to 60 nm and in the range from 10 to 20 nm, can be used.

The optical cavity serves to enhance radiation absorption by the single-crystalline semiconductor film by increasing light-absorber interactions. The cavity amplifies the absorption of radiation by the photoactive semiconductor at the resonant wavelengths of the cavity via multiple reflections at the reflector/spacer and spacer/semiconductor interfaces. Because the resonant wavelengths of the cavity will depend on cavity length, the dielectric spacer thickness can be tailored to spectrally tune the resonance condition for the cavity. For example, spacers with thicknesses in the range from 20 nm to 300 nm can be used.

The dielectric spacer is optically transparent at the operational wavelengths of the optoelectronic device and is desirably made from a material that can be formed as a thin film with precise thickness control. Dielectric materials that can be grown via Atomic Layer Deposition (ALD) are good candidates. These include semimetal oxides and metal oxides, such as aluminum oxide, $Al_2O_3$, $HfO_2$, $SiO_2$, $TiO_2$, ZnO, MgO, $ZrO_2$, $WO_3$, and the like. Because the single-crystalline semiconductor film need not be grown epitaxially on the dielectric spacer, the material for the spacer can be selected independently from the material of the crystalline semiconductor, without the need for lattice matching, and the interface formed by the two materials can be non-epitaxial. As used herein the term "epitaxial structure" refers to a structure in which the crystallographic orientation of an overlying layer is determined by (matches or very nearly matches) that of its underlying layer, such that the two layers have the same crystallographic orientation, at least in the area of their interface. Such epitaxial structures may include strains and stresses at the interface, induced by a lattice mismatch between the two materials and may even include misfit dislocations. In contrast to such epitaxial interfaces, non-epitaxial interfaces have crystallographic orientations that are independent from (e.g., different from) those of their neighboring layers and are free from lattice mismatch-induced strains and stresses.

The reflector of the optical cavity should be highly reflective at the operational wavelengths of the optoelectronic device. Metals are good candidates for the reflector material. By way of illustration, silver reflectors can be used for optoelectronic devices that operate in the infrared, including the near infrared, region of the electromagnetic spectrum and aluminum can be used for optoelectronic devices that operate in the ultraviolet region of the electromagnetic spectrum. However, other metals, such as gold, and non-metals can also be used.

Photodetectors are examples of optoelectronic devices. One embodiment of a photodetector having a field effect transistor geometry is shown schematically in FIG. 3A. The phototransistor includes: an optical cavity composed of an electrically conductive reflector 304 and a dielectric spacer 306 adjacent to the reflector. A single-crystalline semiconductor film 302 is disposed against the dielectric spacer at a non-epitaxial interface. The phototransistor further includes a source electrode 310; and a drain electrode 312, wherein the source electrode and the drain electrode are separated by, and in electrical communication with, single-crystalline semiconductor film 302. In this embodiment of the device, reflector 304 is electrically conductive and provides a gate electrode, while dielectric spacer 306 provides a gate dielectric.

The phototransistor operates as follows. When radiation is incident upon single-crystalline semiconductor film 302, photons having energies greater than the band-gap energy of the semiconductor material are absorbed. This absorption results in the photogeneration of charge carries (electron/hole pairs), which can travel through semiconductor film 302 under an intrinsic or externally-applied electric field. The continuous separation of the photogenerated electron-hole pairs produces a photogenerated drain current, the magnitude of which is proportional to the intensity of the incident radiation. The drain current increases under optical illumination because the incident radiation creates excess electron-hole pairs in the depletion region. Because of this, a photovoltage develops, which modifies the effective gate bias, enhancing the transistor conductivity and increasing the drain current. The resulting modulation of the gate voltage and the drain current can be measured using a current measuring device. The field effect phototransistors can be n-channel transistors or p-channel transistors.

The phototransistors can be fabricated via the release of single-crystalline semiconductor films grown epitaxially on sacrificial substrates and the subsequent transfer of the released films onto the spacer layer of an optical cavity. The release of the single-crystalline films can be carried out by selectively removing (e.g., etching away) the sacrificial growth substrate, or by a Smart Cut process in which a layer of hydrogen ions is implanted below the surface of a bulk layer of the single-crystalline semiconductor and a thin film of the single-crystalline semiconductor is then cleaved away from the bulk layer at the ion implantation layer. Optionally, the resulting released film may be thinned and polished. An embodiment of a Smart Cut process for fabricating a free-standing semiconductor single-crystal film, followed by the transfer of the single-crystal film to an optical cavity is illustrated in the Example.

The optoelectronic devices are able to provide a high normalized photocurrent to dark current ratio (NPDR). For example, photocurrent to dark current ratios of at least $1 \times 10^4$, at least $2 \times 10^4$, and at least $3 \times 10^4$ can be achieved under a bias of 1 V when illuminated with broadband light source (e.g., Xenon light source ASB-XE-175) at an incident power of 40 nW.

Because the spectral responses of the optoelectronic devices can be tailored based on the thickness of the single-crystalline semiconductor film, arrays of the optoelectronic devices having different spectra responses can be assembled to cover a desired spectral response range. Such arrays include a plurality of the optoelectronic devices and within this plurality of devices, at least some of the optoelectronic devices absorb radiation and generate a photoresponse at different wavelengths than other optoelectronic devices. Thus, arrays of photodetectors could be designed to detect radiation over the entire infrared region, the entire visible region, and/or the entire ultraviolet region of the electromagnetic spectrum. Within the arrays, the optoelectronic devices can be arranged in a regular pattern or an irregular or random pattern. The arrays may include, for example, ten or more optoelectronic devices, 100 or more optoelectronic devices, 1000 or more optoelectronic devices, or even 10,000 or more optoelectronic devices.

EXAMPLE

Results and Discussion
Ultra-Thin Crystalline Ge on Foreign Substrates

Figure 1B:
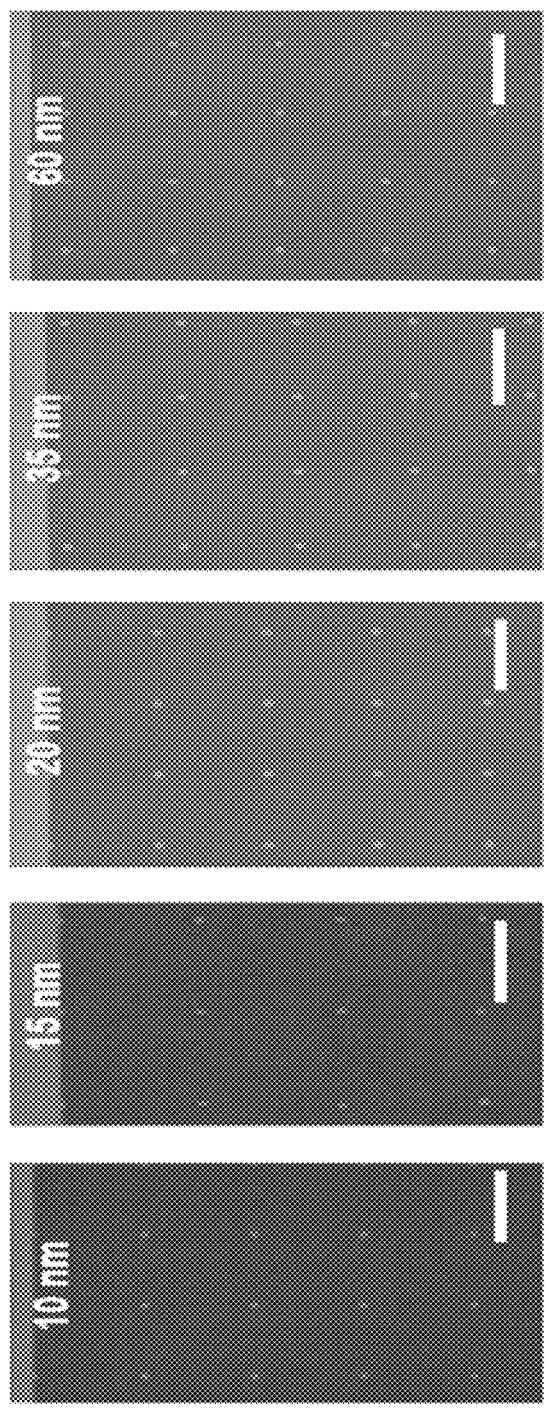
Figure 6:
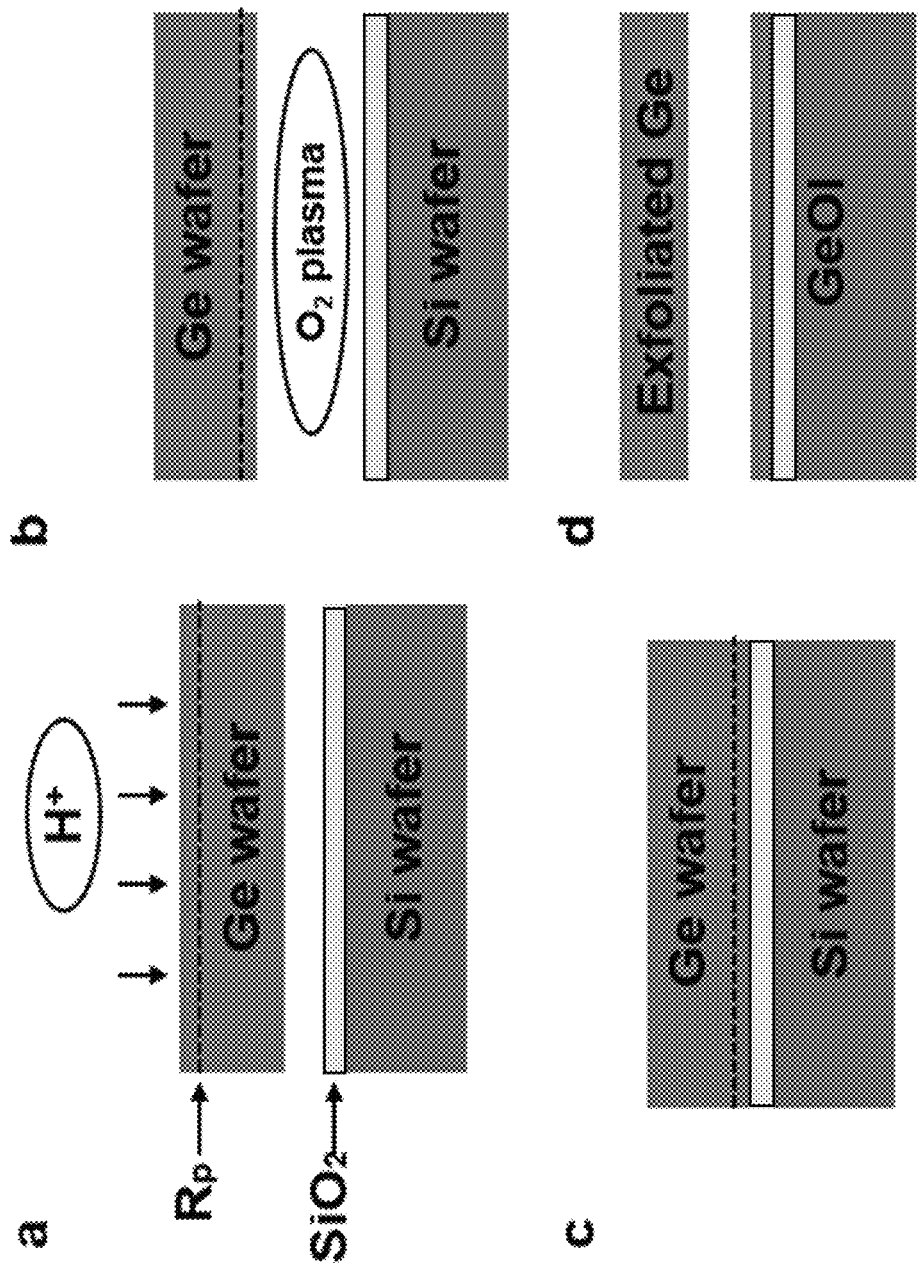
FIG. 6, panels (a) through (d), depicts the fabrication process flow of 4-inch germanium-on-insulator (GeOI) and its finished sample using a Smart-Cut™ based process flow of the GeOI.

In this example, the membrane transfer method was first employed to realize the integration of crystalline semiconductor films with a foreign substrate, as shown in FIG. 1A. At the beginning, a Ge-on-insulator (GeOI) wafer (FIG. 1A(i)) was used as the source wafer. The thicknesses of the top Ge layer and the insulator layer of $SiO_2$ were 100 nm and 1 μm, respectively. The fabrication and characterization details of the GeOI wafer can be found in FIGS. 1A and 6. The top Ge membrane was then released using hydrofluoric acid (HF) (FIG. 1A(ii)) and transferred onto a foreign substrate using polydimethylsiloxane (PDMS) (FIG. 1A(iii)). Finally, low-power dry etching was used to thin down the membrane to the desired thickness (FIG. 1A(iv)). FIG. 1B shows the optical microscope images of transferred Ge membrane samples. The substrate was designed to enhance the light absorption in Ge membranes, and consists of three layers: a top $Al_2O_3$ layer, a middle silver (Ag) layer and a Si substrate. The top Ge film thickness, measured by atomic force microscopy (AFM), ranges from 10 to 60 nm.

These films exhibit different colors under white light illumination because of optical interference (FIG. 1B).

Figures 1C, 1D:
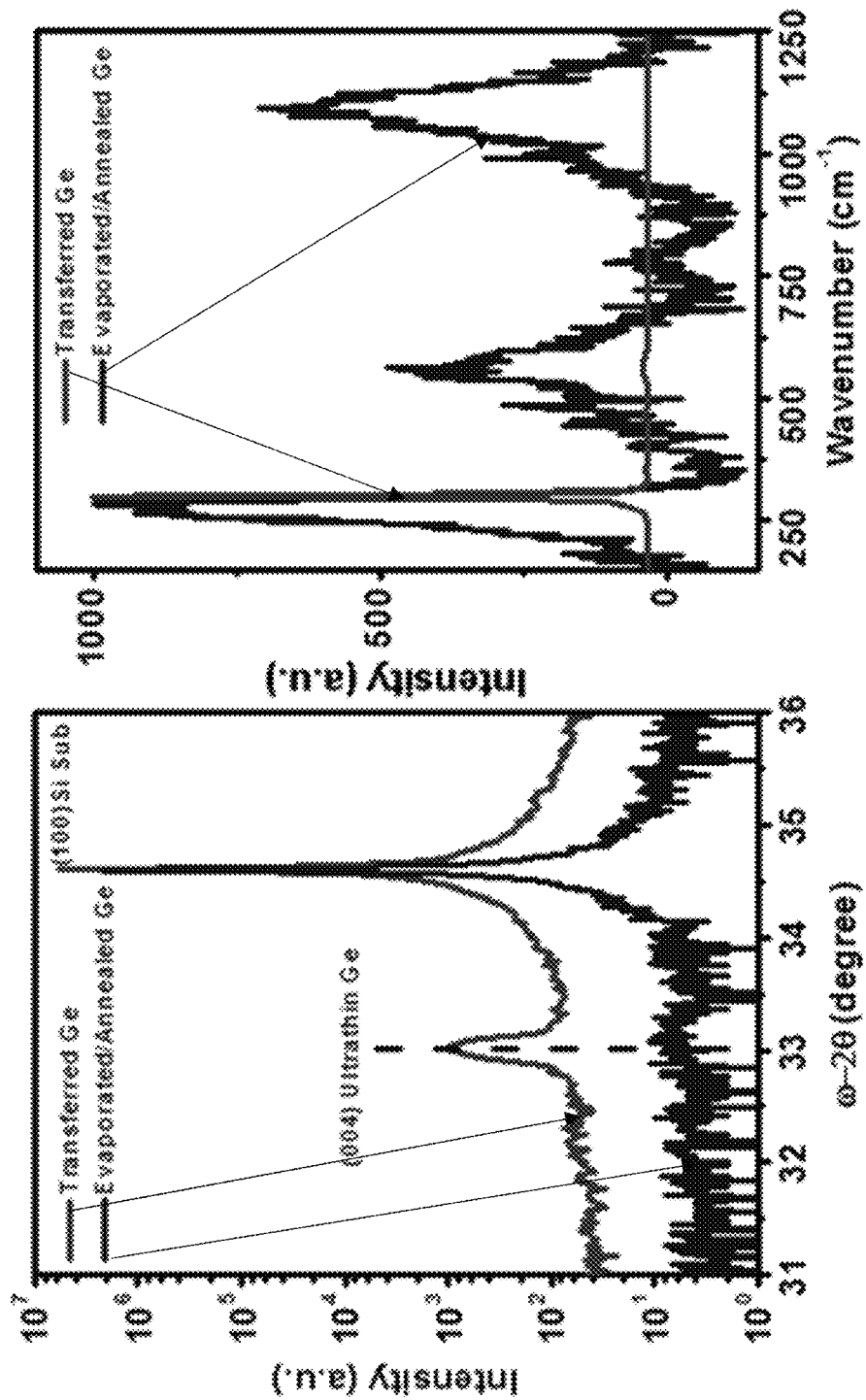

To reveal the crystalline quality of the Ge membrane, high-resolution X-ray diffraction (HR-XRD) characterization was performed. FIG. 1C shows the (004) ω-2θ triple axis scans. A clear peak at 33.1° confirmed the single crystallinity of transferred Ge membranes. In comparison, an evaporated and annealed Ge film with the same thickness was also examined. In this experiment, the evaporated amorphous-Ge film was annealed at 500° C. to improve the crystallinity. However, no peak was observed at 33.1° for the line in FIG. 1C, which indicated the lack of single crystallinity. This comparison revealed the advantage of the membrane transfer method in the quality of Ge films, which is important for the performance of photodetectors. Another peak in FIG. 1C at the angle of 34.6° came from the (100) Si substrate, which was observed in both samples. FIG. 1D shows the Raman spectroscopy of these two samples. One can see a single peak at the wavenumber of 300.9 cm$^{-1}$ for the transferred Ge membrane, which is another signature of the single-crystalline Ge film. In contrast, multiple peaks were observed in the evaporated and annealed Ge film. These peaks were attributed to the Ge—$H_x$ and second order Ge—Ge bonds formed in the annealing process. Both the XRD and Raman results showed excellent crystalline properties of the transferred Ge films. Next, the design of the foreign substrate to enhance the light-matter interaction within this crystalline thin film is discussed.

Foreign Substrate with Effective Photon Management

Figure 2D:
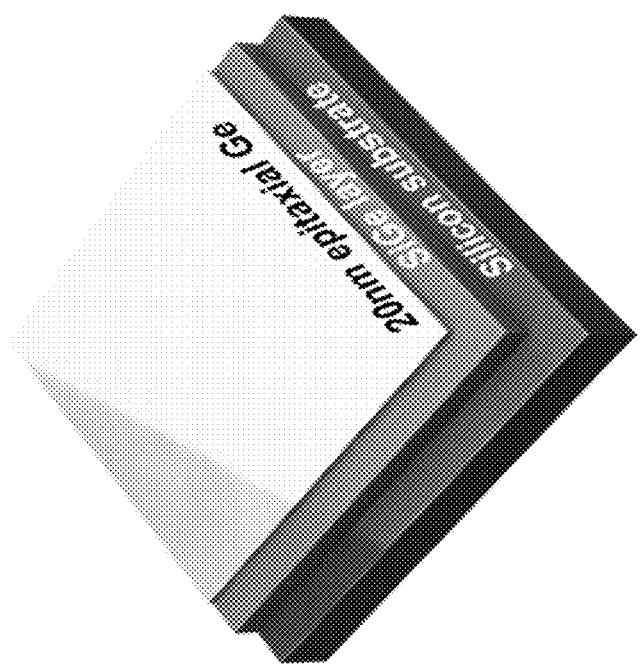
FIGS. 2A-2F depict absorption results for ultra-thin Ge nanomembrane on a foreign substrate and a comparison with a traditional structure.
Figure 2A:
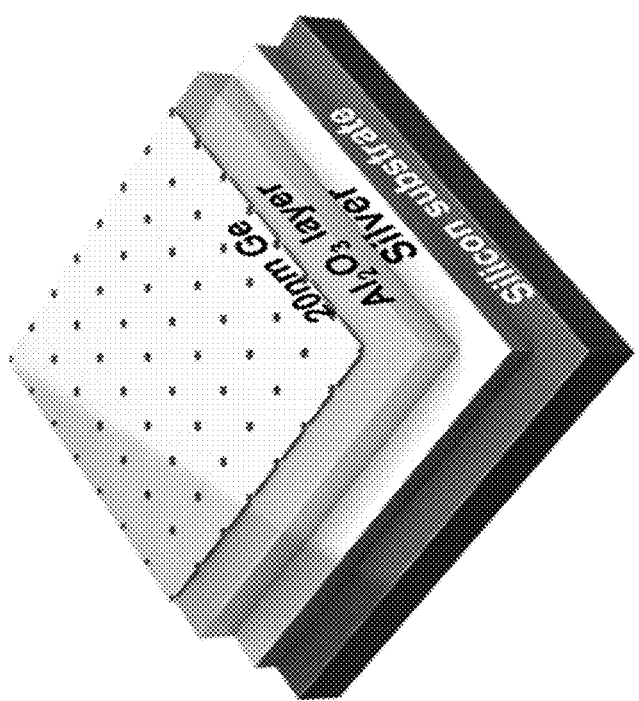
Figures 2B, 2C:
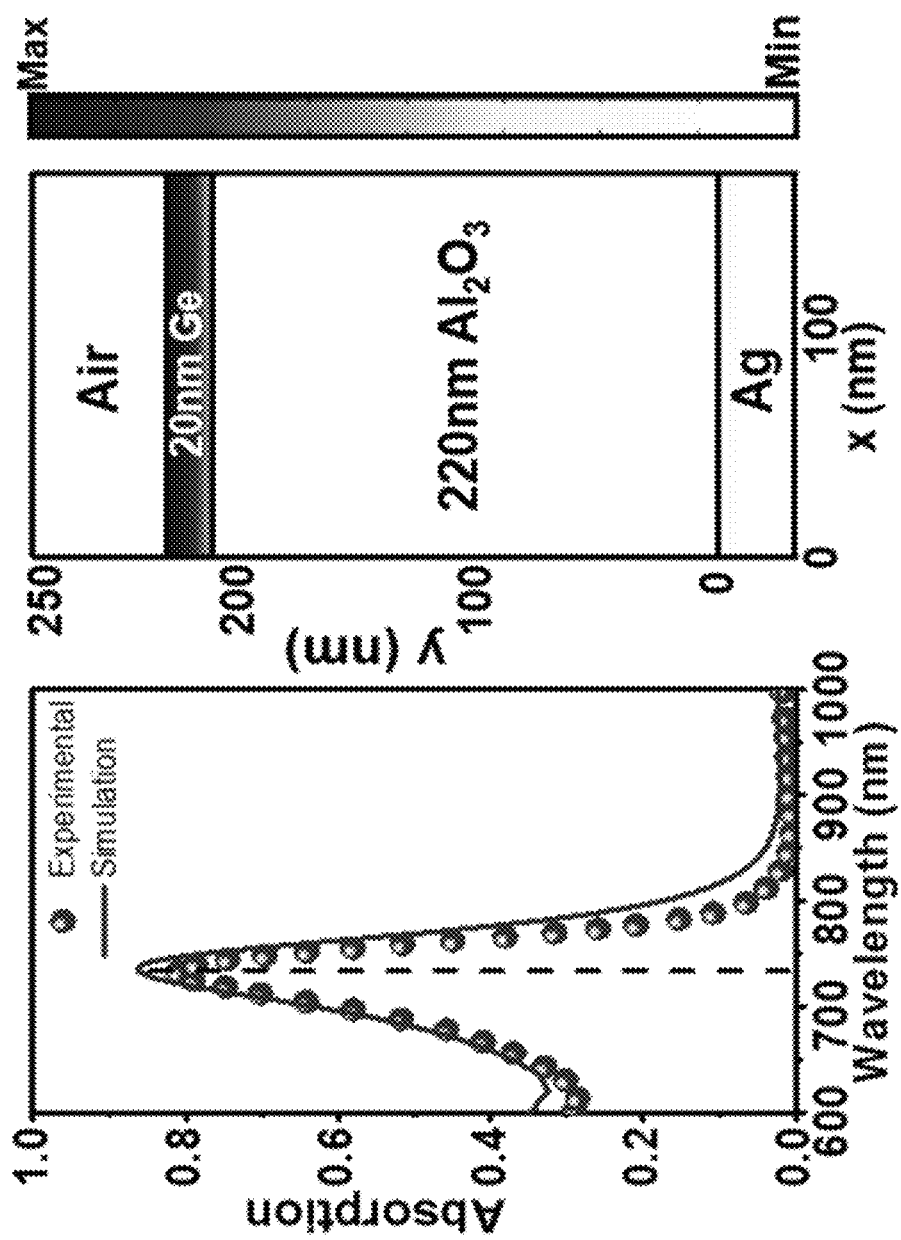
Figures 2E, 2F:
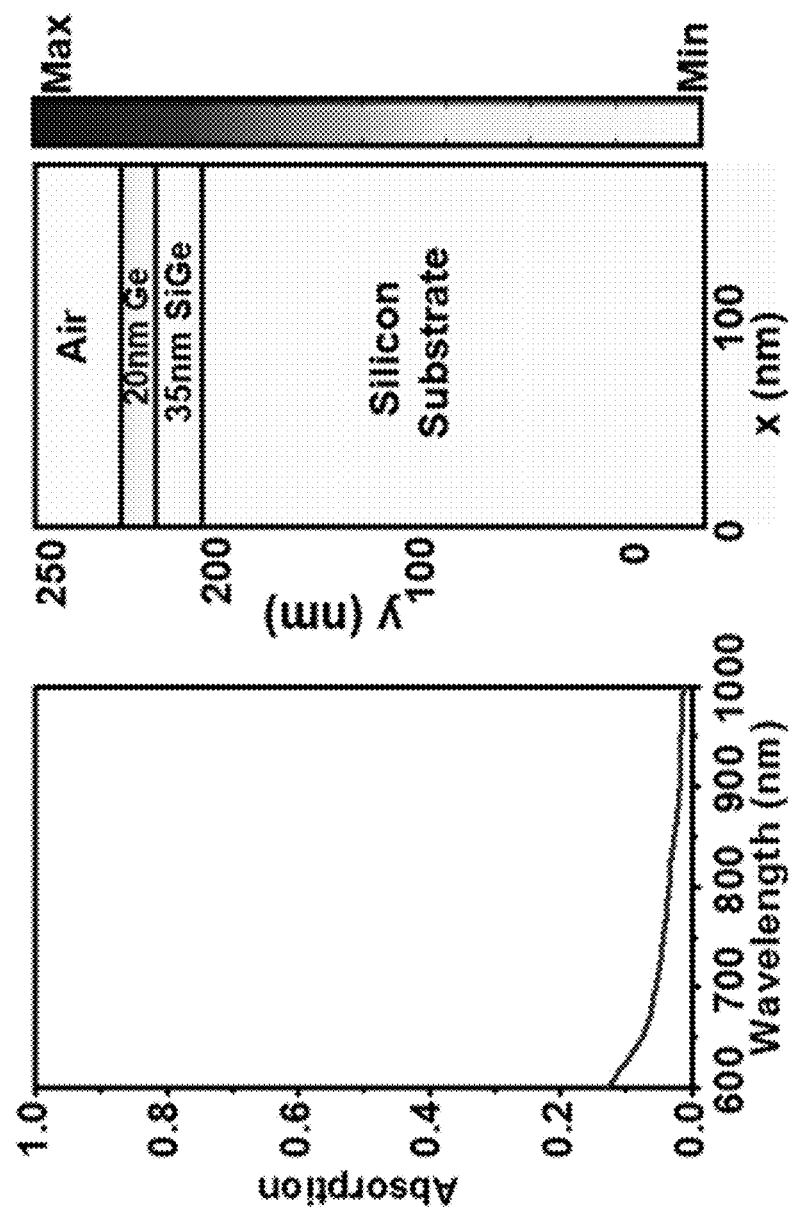

Predesigned foreign substrates allow a functionalized nanocavity structure to be used to greatly improve the light absorption in nanometer-thin Ge films. The absorption depth of Ge varies from approximately 120 nm (at the wavelength of 700 nm) to 390 nm (at the wavelength of 900 nm), much thicker than these thin films. In this case, the absorption in a 20-nm-thick region is less than 16% in this wavelength range. To overcome this limitation of weak absorption, a layered substrate that consists of a 220-nm-thick lossless dielectric spacer and a reflective Ag mirror was used to form a functionalized nanocavity structure (FIG. 2A). As shown by the solid line in FIG. 2B, the simulated absorption in a 20-nm-thick Ge membrane on a 220-nm-thick $Al_2O_3$/Ag cavity reached 81% around the resonant wavelength of 733 nm. The spatial distribution of light absorption, obtained in a simulation based on the finite element method, showed enhanced absorption in the ultra-thin layer of Ge (FIG. 2C). In contrast, the absorption in ultra-thin crystalline Ge films without photon management was weak. For example, ultra-thin crystalline Ge films can also be fabricated using epitaxial growth (FIG. 2D). (See, J. Wang, et al., Ge-Photodetectors for Si-Based Optoelectronic Integration. *Sensors*. 11, 696-718 (2011).) However, the substrate should be a SiGe buffer layer to fulfill the lattice matching condition. Under this situation, the same Ge film absorbed less than 10% of the incident light at 733 nm, as shown in FIG. 2E. The spatial distribution of light absorption in this system is shown in FIG. 2F, with the same color map in FIG. 2D, showing obviously weaker absorption within the 20-nm-thick Ge film. Therefore, the foreign nanocavity substrate was shown to significantly enhance the optical absorption within the ultra-thin crystalline film, which is highly desirable for optoelectronic devices.

Nanocavity Enhanced Photodetector

Figures 3A, 3B:
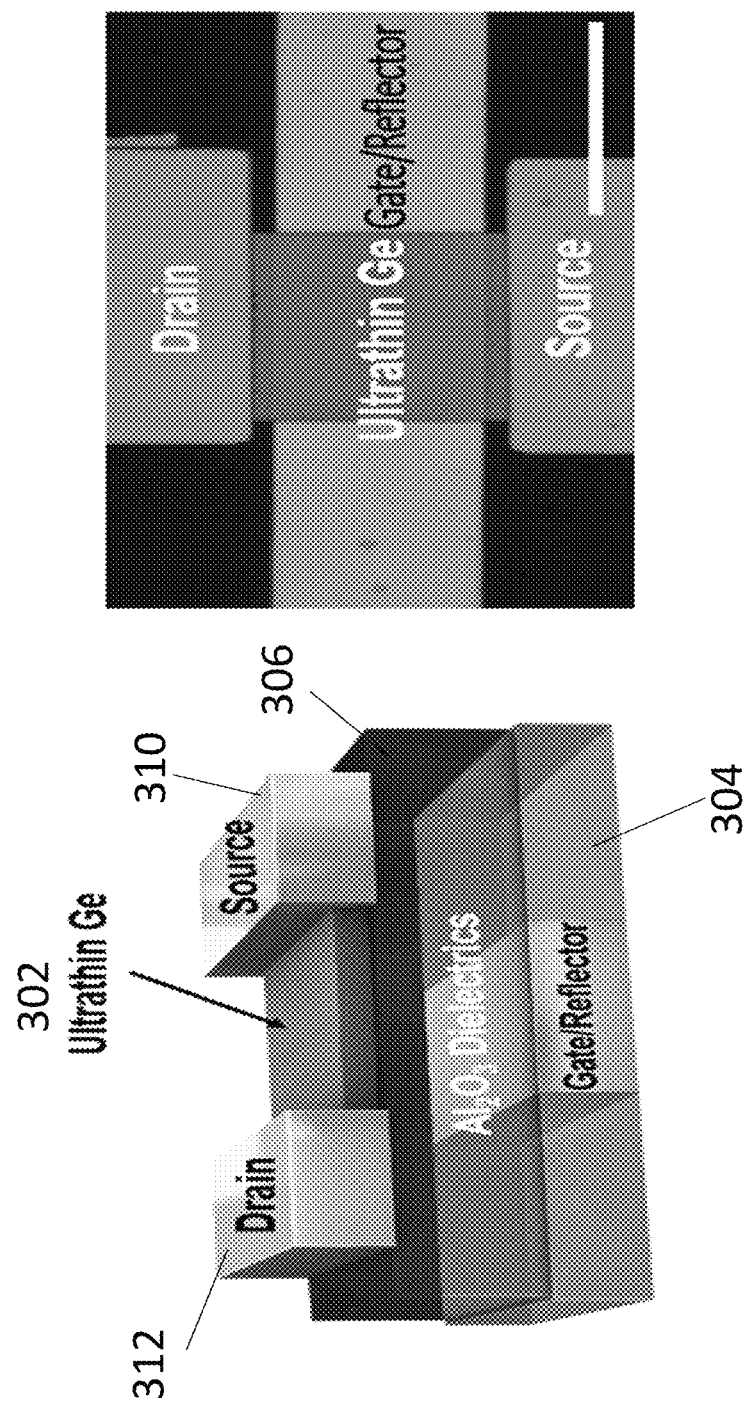
FIGS. 3A-3F depict the current-voltage measurements for an ultra-thin Ge photodetector in both dark and illuminated conditions.
Figure 3D:
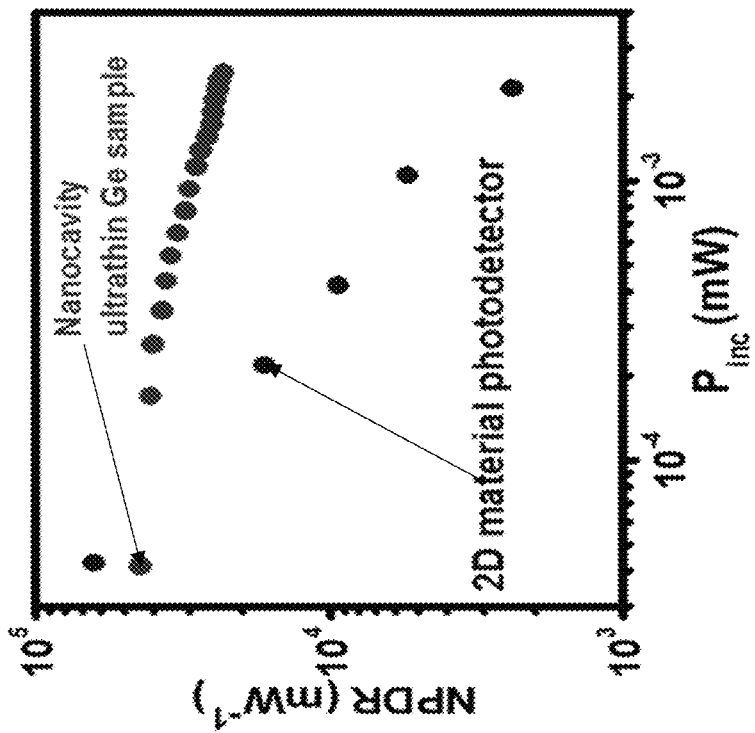
Figure 3C:
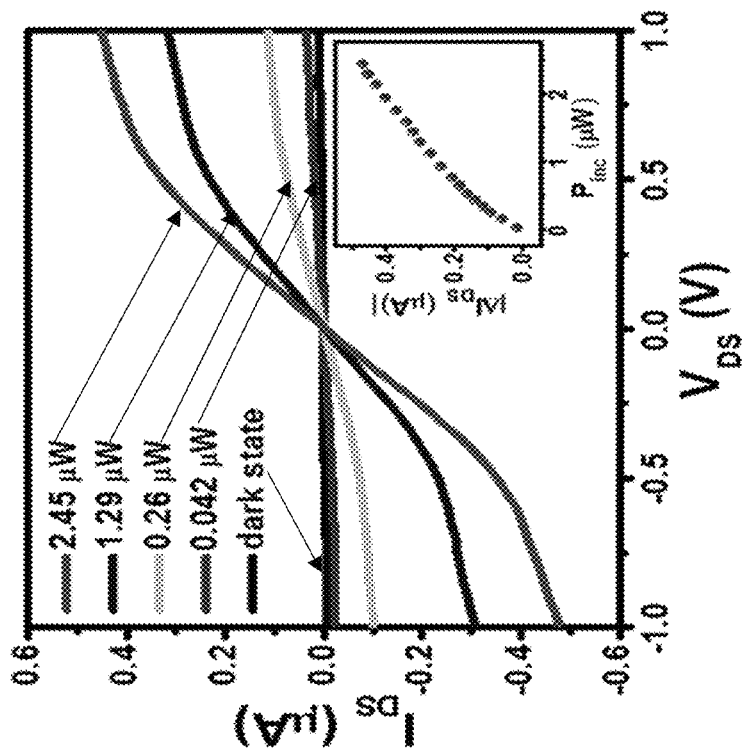

The schematic of a nanocavity enhanced photodetector device and its optical microscope image are shown in FIGS. 3A and 3B, respectively. This device was first fabricated and its performance was measured under both dark and illuminated conditions. To add source and drain metal electrodes, the sample was spin coated with photoresist. Optical lithography or electron beam lithography was used to pattern the photoresist. Electron beam evaporator was used to deposit Ni/Au on the patterned surface, followed by a lift-off process. In this experiment, a 17-nm-thick p-type (gallium-doped) Ge nanomembrane was placed on a 220-nm-thick $Al_2O_3$/Ag cavity and an absorption peak at 733 nm was obtained (dotted line in FIG. 2B), agreeing well with the theoretical prediction (solid line in FIG. 2B). The slight difference in Ge film thickness should be attributed to the optical constant difference of this p-type Ge film. In particular, the bottom Ag film served a dual role of mirror and gate electrode for this nanomembrane-based field-effect transistor device. By using nickel/gold (Ni/Au) as the contact electrode, an Ohmic-like contact was realized for the photoconductor, as shown by the current-voltage (I-V) sweep results in FIG. 3C. An I-V sweep was repeated under different illumination intensities by tuning the monochromatic 733-nm light source from 42 nW to 2.45 μW. The photocurrent ($|\Delta I_{DS}|$) at the bias of 1 V could be calculated by the equation $|\Delta I_{DS}|=|I_{dark}|$, where the $I_{DS}$ is the drain-source current under illumination and $I_{dark}$ is the dark current. The photocurrent was then plotted, $|\Delta I_{DS}|$, as the function of the incident power, $P_{inc}$, illuminated on the ultra-thin Ge layer (25 μm×50 μm) as shown in the inset of FIG. 3C. From the linear fitting of the photocurrent with the illuminated power, the photoresponsivity (R) of this device could be extracted, and was found to be 0.17 A/W (i.e., $R=|\Delta I_{DS}|/P_{inc}$).

Stable and Improved Normalized Photo-Current-to-Dark-Current-Ratio

One important figure of merit for metal-semiconductor-metal (MSM) photodetectors is the normalized photo-current-to-dark-current-ratio [NPDR=$(|\Delta I_{DS}|/I_{dark})/P_{inc}$]. A larger value of this parameter indicates better suppression of dark current without sacrificing photoresponsivity. Considering the previously reported MSM photodetector based on Ge wafers, the highest reported NPDR, to our knowledge, was 3,158 mW$^{-1}$. In contrast, under the bias of 1 V, the NPDR of this device was in the range of 10$^4$ mW$^{-1}$ (FIG. 3D), which is over one order of magnitude higher than the previous work. In this experiment, the stability of the NPDR was first investigated by increasing the incident power, $P_{inc}$, using a Xenon light source (ASB-XE-175). One can see that the NPDR of the ultra-thin Ge sample was relatively stable in the power range from 42 nW to 2.45 μW. For comparison, the NPDR of a previously reported 2D material device based on $MoS_2$ was also plotted. This device had an NPDR with a significant change, from a value of 6.37×10$^4$ mW$^{-1}$ at low incidence power, to 2.39×10$^3$ mW$^{-1}$ (i.e., one order of magnitude lower) when the incidence power reached the μW level. This drop was attributed to the saturation of the trap states with increased light intensity. Based on the relationship between detectivity (D) and NPDR (i.e., D=NPDR× $(I_{dark}/2q)^{1/2}$, where the electronic charge q=1.6×10$^{-19}$ C), this dramatic decrease of NPDR indicates a decreased detectivity of the 2D material photodetector as the optical illumination increases. However, the stable NPDR of this nanocavity sample renders a stable detectivity in the investigated incidence power range, further demonstrating the high quality of the single crystalline Ge nanomembranes.

Figures 3E, 3F:
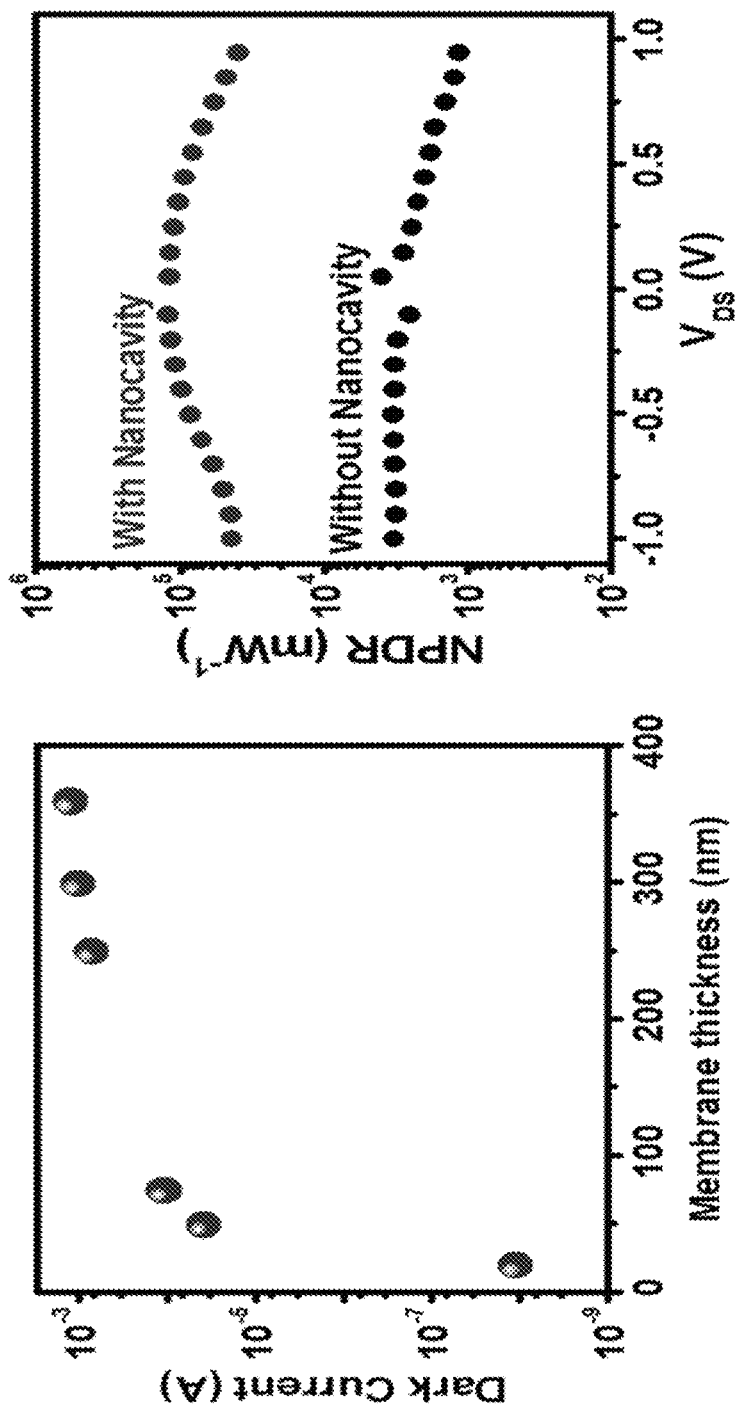
Figure 9:
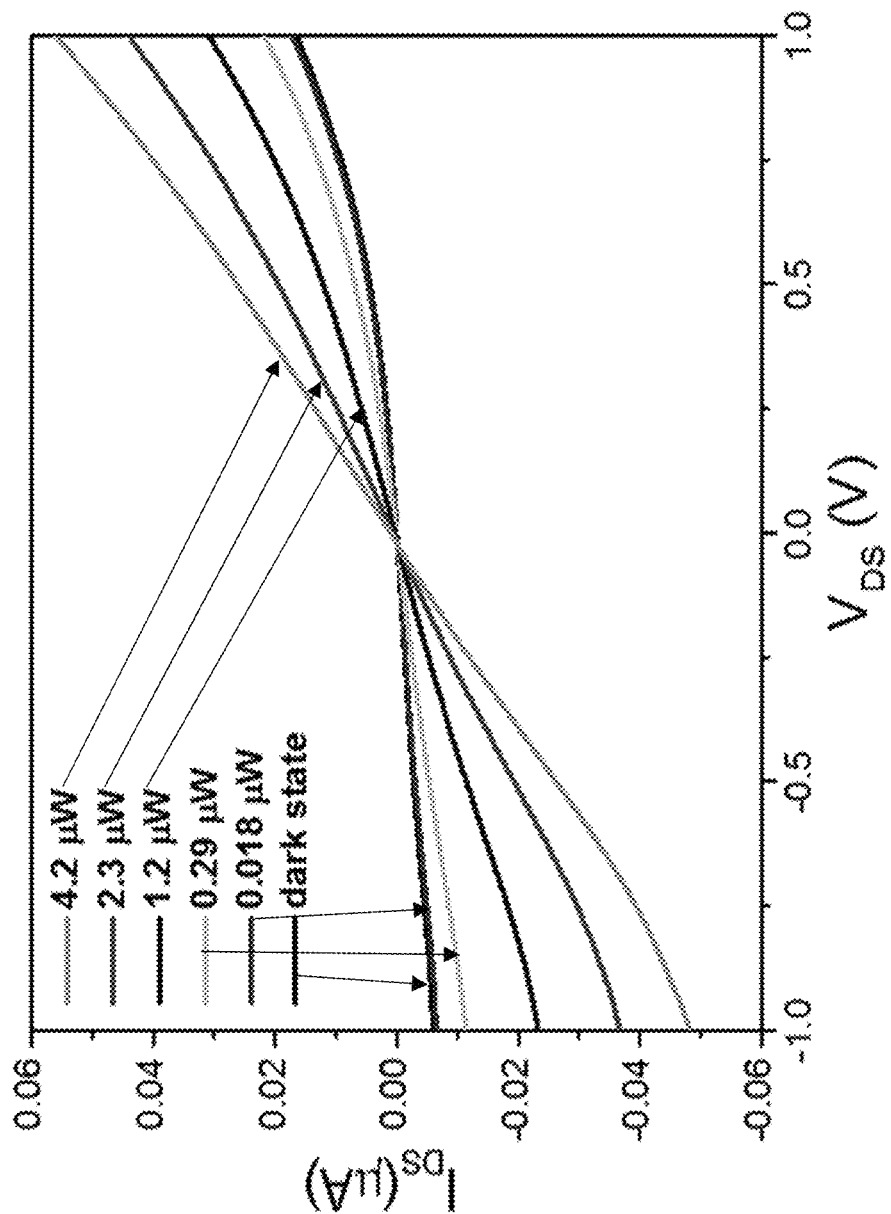
FIG. 9 shows the dark current and the photo response for an ultra-thin Ge film under different illumination powers.

In addition to the stability of NPDR, the enhanced NPDR compared with previous reports can be attributed to two mechanisms. The first one is the suppression of the dark current, $I_{dark}$, introduced by the ultra-thin Ge film. In order to verify the suppression, photoconductors were fabricated with various Ge thicknesses and their dark currents (FIGS. 8A-8F) were measured. As shown in FIG. 3E, the dark current decreases from mA to nA level as the Ge thickness reduces from 350 nm to 20 nm. Generally, ultra-thin Ge nanomembranes intrinsically bring about low absorption, which limits the photocurrent, $|\Delta I_{DS}|$, and thus results in a relatively small NPDR. By introducing the foreign nanocavity, however, the absorption will be significantly enhanced, corresponding to enhanced photocurrent, which is the second reason for the improved NPDR. To better reveal the dependence of NPDR on absorption, another photodetector was fabricated that had a GeOI structure. The thickness of the $SiO_2$ in the GeOI sample was 1 μm (FIG. 9). Since the thickness of the Ge film was similar to that in the nanocavity sample (i.e., 20 nm), the dark currents of the two samples were suppressed to a similar level. FIG. 3F shows the comparison of NPDR between these two photodetectors. One can clearly see that, under the same bias, the nanocavity sample delivers one order of magnitude higher NPDR (i.e., $\sim 4 \times 10^4$ $mW^{-1}$) than that of the GeOI sample ($\sim 3 \times 10^3$ $mW^{-1}$). The absorption in the Ge layer of the nanocavity sample was 81% (FIG. 2B), which is also one order of magnitude larger than that of the GeOI sample (6.1%, based on our simulation), demonstrating the contribution of the enhanced absorption to NPDR. Furthermore, the gate-controlled performance of the phototransistors also took advantage of the high absorption, as will be analyzed in the next section.

Device Physics

General Electronic Properties of the Single-Crystalline Nanomembrane Transistor

To further interpret the electronic properties of the single-crystalline Ge nanomembrane transistor, the dark drain-source current, $|I_{DS}|$, of the device with the 17-nm-thick Ge film (discussed in FIGS. 3A, 3B, 3C, 3D, 3E, and 3F) was then characterized as a function of the gate voltage, $V_{GS}$, under $V_{DS}$ of −1 V. As shown by the dashed curve plotted in the log scale in FIG. 4A, the ultra-thin transistor showed ambipolar behavior. By extrapolating the linear portion of the $I_{DS}$-$V_{GS}$ curve in the linear scale (solid curve), one can extract the threshold voltage of the transistor, $V_{TH}$. Furthermore, one can estimate the hole field-effect mobility, $\mu_p$, using the equation $\mu_p=(L/W)C_{ox}^{-1}V_{DS}^{-1}(\partial I_{DS}/\partial V_{DS})$, where L and W are the Ge nanomembrane channel length and width (i.e., 25 μm and 50 μm), respectively; and $C_{ox}$ is the gate capacitance per unit area of the $Ge/Al_2O_3/Ag$ system (i.e., $3.647 \times 10^{-8}$ $F/cm^2$), determined by the expression $C_{ox}=\varepsilon_{ox}/t_{ox}=\varepsilon_0 \varepsilon_{Al2O3}/t_{Al2O3}$. Here, $\varepsilon_o$ is the vacuum absolute dielectric constant (i.e., $8.85 \times 10^{-12}$ F/m), $\varepsilon_{Al2O3}$ is the relative $Al_2O_3$ dielectric constant (i.e., 8.1 for evaporated $Al_2O_3$ layer), and $t_{Al2O3}$ is the thickness of the $Al_2O_3$ layer (i.e., 220 nm). As a result, the maximum $\mu_p$ of this 17-nm-thick Ge membrane transistor can be estimated to be ~148.1 $cm^2V^{-1}S^{-1}$ in the linear portion when $V_{GS}$ varies from −5 to −7.5 V (as indicated by the black line in FIG. 4A). This value is among the best reported results due to the single crystalline material quality. Intriguingly, this nanocavity manipulated device has unique properties on its gate-controlled responses, as will be discussed next.

Gate Controlled Photocurrent Response

Figure 4B:
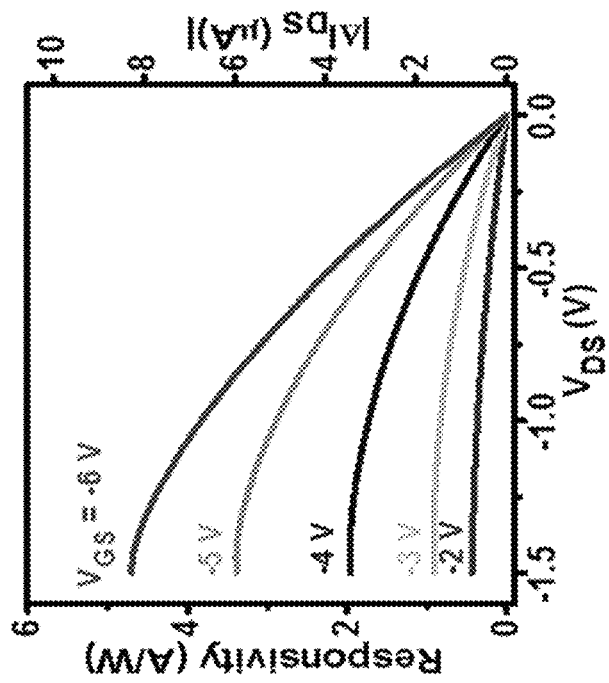
FIGS. 4A-4D depict measurements for an ultra-thin Ge phototransistor and an analysis of the same.
Figure 4A:
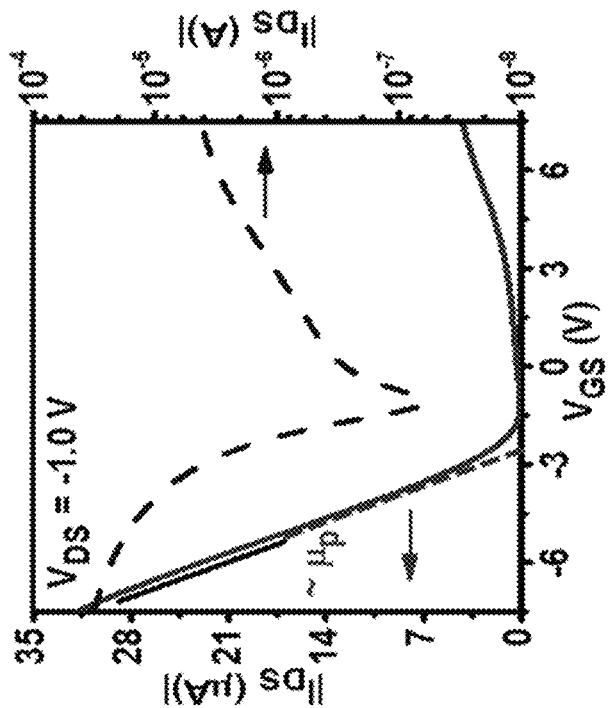

To reveal the gate-controlled optical response of this device, the $V_{DS}$ was then swept under different $V_{GS}$ in a steady optical incidence condition of 140.8 $mW/cm^2$. As shown in FIG. 4B, the photocurrent $\Delta I_{DS}|$ increased as $V_{GS}$ decreased from −2 to −6 V. Particularly, when $V_{DS}=−1.5$ V and $V_{GS}=−6$ V, the photoresponsivity was 4.7 A/W, which is 27.6 times larger than the responsivity of 0.17 A/W under zero gate voltage. This enhancement can be attributed to the photogating effect which plays a dominant role in many nanostructured devices, especially in nanowires, quantum dots and 2D-material-based photodetectors. However, in most of the aforementioned devices, the photogating effect relies on trap states in nanostructured materials acting as localized states in the photodetecting channel. The trap-state-mediated photogating effect limits the reproducibility of the photodetector performance, since the number of trap states cannot be controlled precisely in the fabrication process. Moreover, the saturation of the trap states under strong incident power has usually resulted in decreased gain.

Figure 4D:
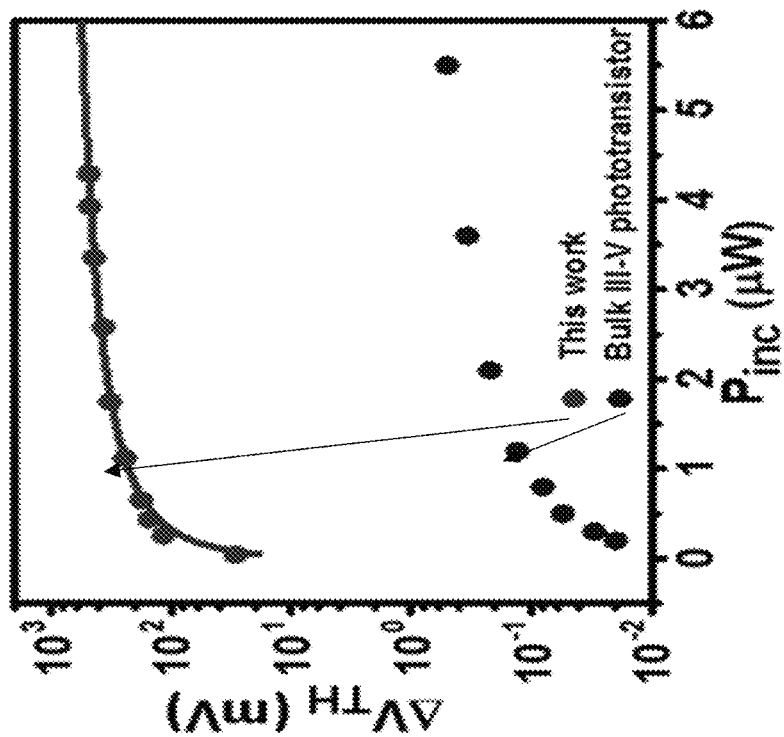
Figure 4C:
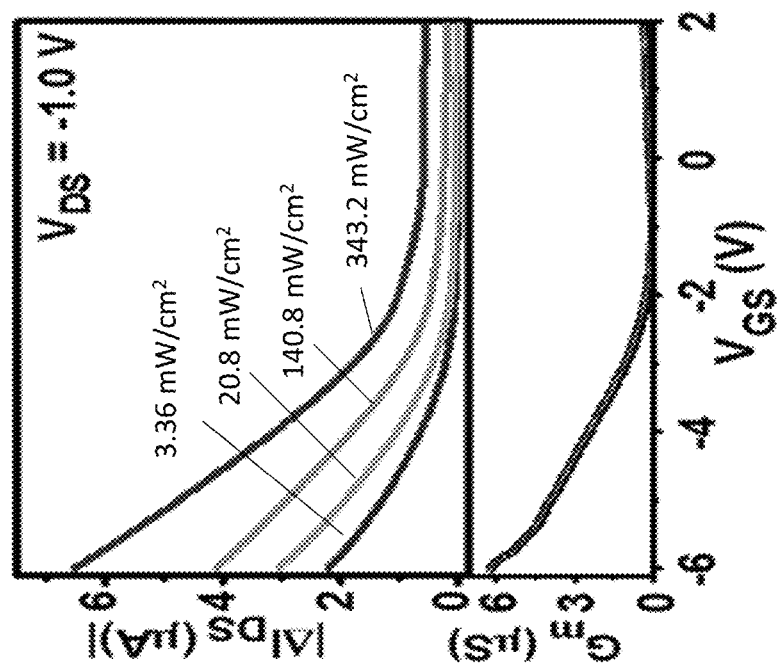
Figure 10:
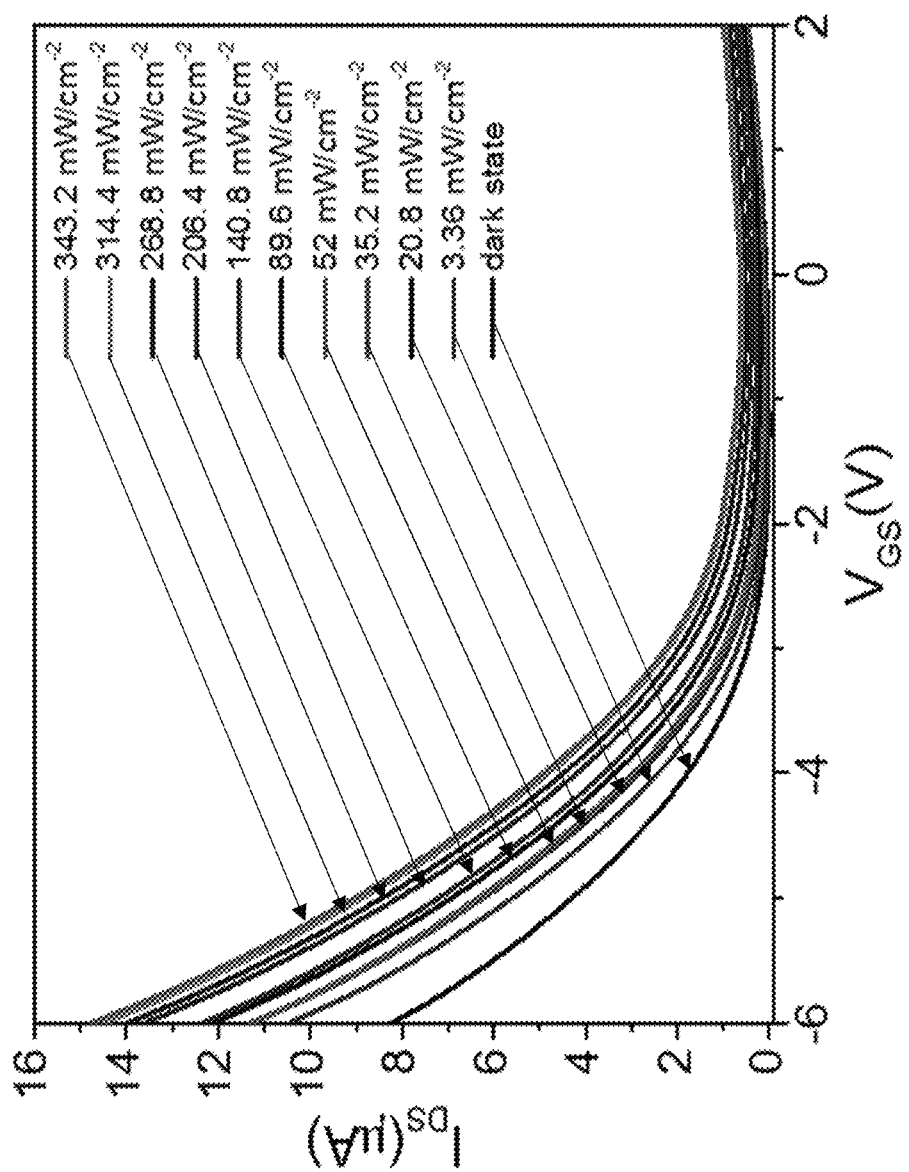
FIG. 10 depicts the $V_{GS}$-$I_{DS}$ curve under dark conditions, as well as various other illumination conditions.

In contrast, the photogating effect in the developed cavity-manipulated ultra-thin nanomembrane phototransistor was mostly caused by the high optical absorption and corresponding photo-generated carriers confined within the ultra-thin Ge films, rather than the trap states. The high absorption at the desired wavelength could be precisely controlled by tuning the thickness of either Ge or $Al_2O_3$ layers. The absorbed photons generated carriers confined in the Ge channel, resulting in improved photoconductivity. To reveal the photo gating effect quantitatively (i.e., $|\Delta I_{DS}|=|G_m|\Delta V_{TH}$, where $\Delta V_{TH}$ is the photon-induced change of the threshold voltage), the relationship of the photo current, $\Delta I_{DS}$, with the device trans-conductance $|G_m|$, ($|G_m|=|\partial I_{DS}/\partial V_{GS}|$), which can be extracted from FIG. 4A as shown in the lower panel of FIG. 4C, was then analyzed. In this experiment, the gate voltage $V_{GS}$ was swept under $V_{DS}$ at −1 V, and $|\Delta I_{DS}|$ was extracted, which resulted from $\Delta V_{TH}$ under different optical illumination conditions, as shown by the curves in the upper panel of FIG. 4C and by FIG. 10. One could see that these $|\Delta I_{DS}|$-$V_{GS}$ curves were consistent with the $|G_m|$-$V_{GS}$ curve, confirming that the gate controlled photo current resulted from the photo gating effect.

In addition, the photo gating effect expression (i.e., $|\Delta I_{DS}|=|G_m|\Delta V_{TH}$) showed that with a given $V_{GS}$, a bigger change of threshold voltage, $\Delta V_{TH}$, lead to a larger photo current, $|\Delta I_{DS}|$. To compare the device with a typical phototransistor based on epitaxially-grown high-quality III-V materials with similar photo gating effects, which do not rely on trap states either, the $\Delta V_{TH}$ of both devices in FIG. 4D was extracted. (See, Y. Takanashi, et al., Characteristics of InAlAs/InGaAs high-electron-mobility transistors under illumination with modulated light. *IEEE Trans. Electron Devices.* 46, 2271-2277 (1999).) One could see that the $\Delta V_{TH}$ of the single crystalline Ge-membrane-based device was three orders of magnitude larger than those of the III-V phototransistors. According to the empirical equation to describe the photo-gating-induced $\Delta V_{TH}$ (i.e., $\Delta V_{TH}=(nkT/q) \times \ln[1+(\eta q P_{inc})/(I_{dark} h\upsilon)]$ from Takanashi et al., *IEEE Trans. Electron Devices.* 46, 2271-2277 (1999), the incident power ($P_{inc}$) can be related with $\Delta V_{TH}$, as shown by the curve in FIG. 4D. Here, n is an empirical constant for fitting (n=8.94 obtained by the least squares method), k is the Boltzmann constant ($1.38 \times 10^{-23}$ J/K), T is the temperature (300 K), h is the Planck constant ($6.63 \times 10^{-34}$ J·s) and $\upsilon$ is the frequency of light ($4.09 \times 10^{14}$ Hz, corresponding to 733 nm). The excellent fitting confirmed that the large $\Delta V_{TH}$ was contributed by the strong absorption ($\eta$) due to the nanocavity, and the effective suppression of dark current ($I_{dark}$) owing to the ultra-thin Ge channel. As a result, the ultra-thin-Ge-based phototransistor could generate a stronger signal than a traditional III-V based device with a similar trans-conductance. This enhanced photocurrent can be used to improve the performance of thin film photodetectors, especially as pixels of sensor arrays and imagers are increasingly miniaturized. Intriguingly, the absorption enhancement resonance can be manipulated by controlling the nanocavity structure, which will enable the development of new multi-spectral sensing on the same chip.

Notably, by adding a gate voltage to the device, a high density of charge carriers in the ultrathin film is induced due to plasma effects. Thus, the extinction ratio (k) will be increased. Due to the Kramers-Kronig relations of the refractive index (n) with extinction ratio (k), the n also will be changed when the extinction ratio (k) changes. These changes lead to tunable spectral response of the device. By adding the gate voltage up to 3 volts, the peak sensing wavelength can be tuned up to 15 nm, which takes up 50% of one optical communication bandwidth. For example, the dense wavelength division multiplexing (DWDM) uses the C-band (1530 nm to 1565 nm) as the total bandwidth of the communication, the total bandwidth is about 35 nm. Therefore, the device can cover a whole optical communication bandwidth.

Figures 5A, 5B:
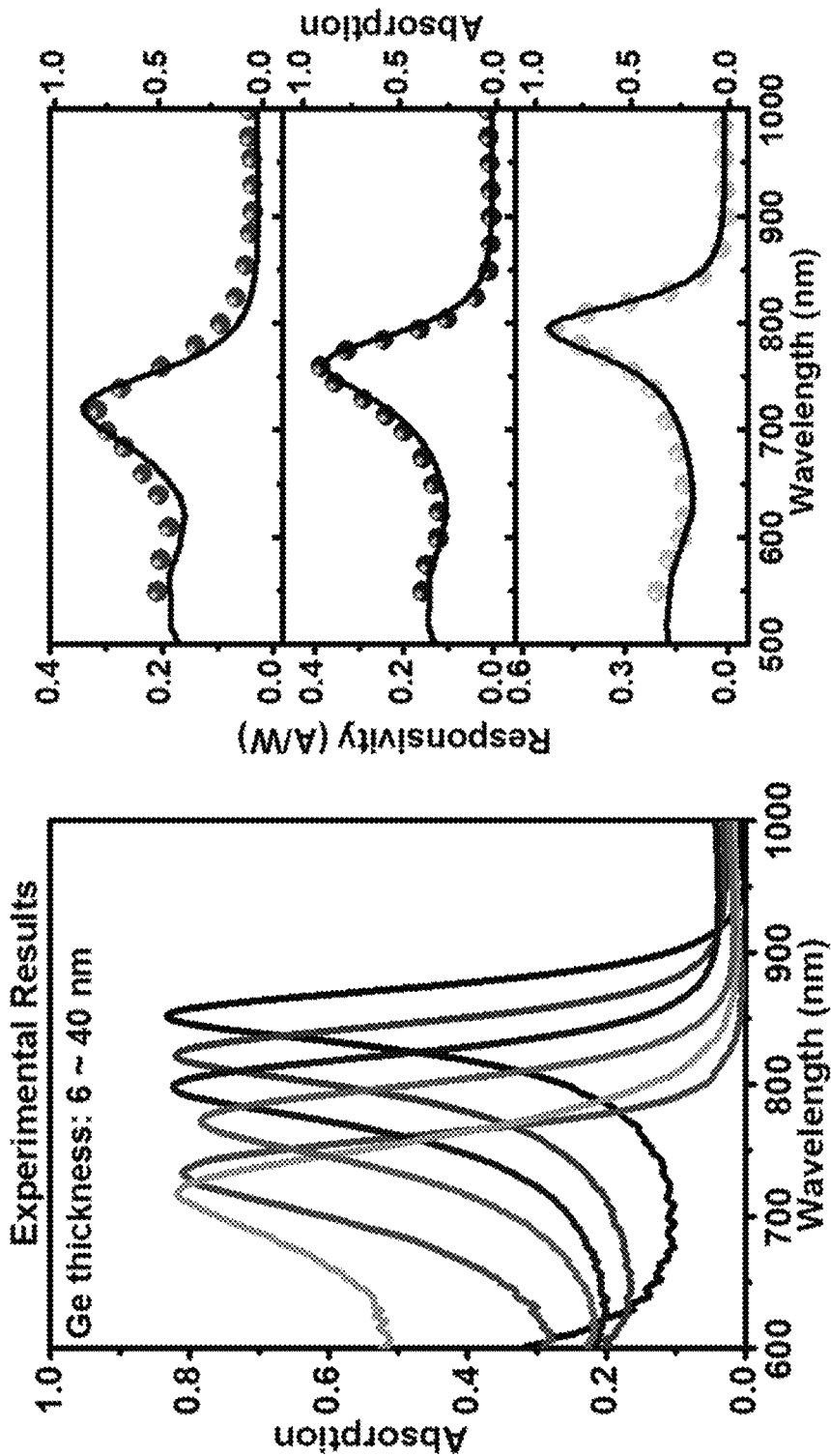
FIGS. 5A and 5B show absorption measurements for an ultra-thin Ge sample with varying thicknesses (from 6 to 40 nm) and the spectral photocurrent response.
Figure 11:
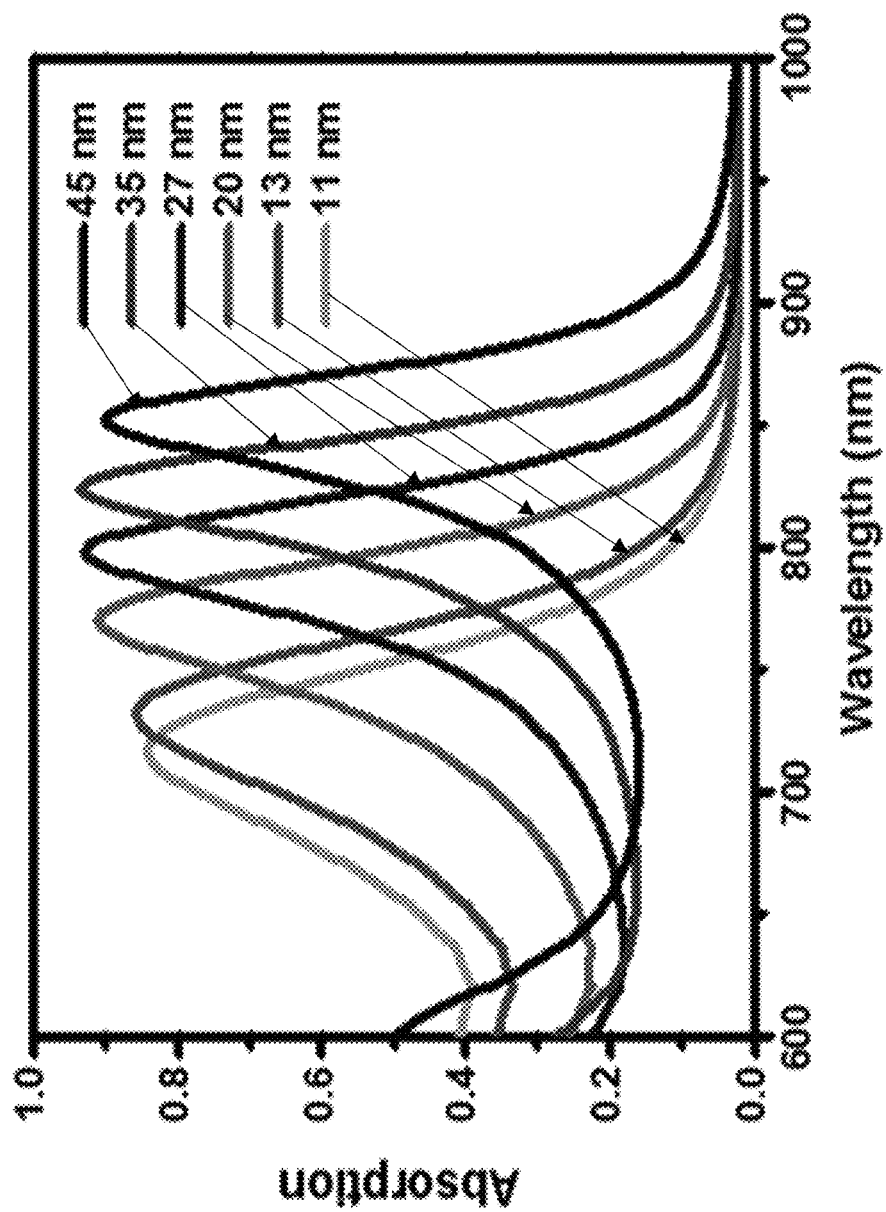
FIG. 11 shows simulated absorption spectra for ultra-thin Ge nanomembranes on a 220-nm-thick $Al_2O_3$/Ag nanocavity substrate.

Spectral Response and Tunability: The Potential for Multi-Spectral Sensing on the Same Chip The ultra-thin thickness, in addition to its benefit in electrical properties, also provides a new optical functionality for multi-spectral sensing because its response exhibits strong spectral tunability. To demonstrate this tunability, a series of nanocavity manipulated photodetectors was fabricated by changing the thickness of the Ge membrane on a 220 nm-$Al_2O_3$/Ag cavity. FIG. 5A shows the experimentally measured light absorption spectra of these samples. As the thickness of Ge film increased from 6 to 40 nm, the wavelength of the absorption peak changed from 715 to 862 nm, agreeing very well with numerical simulations listed in FIG. 11. To demonstrate the spectrally tunable photoresponse, the photocurrent spectra for three photodetectors were measured with their Ge thicknesses of 12 nm, 17 nm and 26 nm, respectively, as shown in FIG. 5B. In this experiment, a supercontinuum laser coupled with a monochromator was used as the light source. The photoresponsivity of all devices was measured under the same bias voltage of 1 V. In FIG. 5B, the simulated light absorption spectra was also plotted by solid curves, showing excellent agreement with the measured photocurrent responsivities (dots) and demonstrating spectral tunability. Therefore, a multi-spectral ultra-thin Ge photodetector array was realizable by transferring different crystalline Ge membranes onto the predesigned nanocavity substrate.

CONCLUSION

In summary, a nanocavity-enhanced single-crystalline Ge nanomembrane photodetector was developed. The fabrication processes successfully thinned down the Ge films to as thin as 10 nm and maintained the single-crystal material quality of the nanomembranes. The photoresponsivity could reach up to 4.7 A/W, resulting from the enhanced absorption and gate modulation. Due to the significantly reduced volume of the active material, the dark current was reduced significantly. Along with the increased photocurrent due to the enhanced optical absorption within Ge nanomembranes, NPDR as high as ~$10^5$ $mW^{-1}$ was realized. By characterizing the gate-controlled performance, the device physics of this ultra-thin film photodetector were analyzed, and showed an obvious photo gating effect. The enhanced absorption and confinement of the carriers lead to a large change of threshold voltage and thus enhanced photoconductivity. By integrating the Ge membranes (10~30 nm) with predesigned nanocavities, spectrally tunable thin-film phototransistors were demonstrated. Importantly, due to the CMOS compatible processes, the proposed single-crystal Ge membrane ultra-thin-film transistors can be fabricated over a large scale (e.g. wafer scale), which is superior to current 2D-material-based optoelectronic devices and can be a competivite building block for the next generation of functional electronic/optoelectronic circuits.

Fabrication and Characterization of the Lab-Made GeOI Wafer

The smart-cut process was used to fabricate the GeOI. (See, L. Tang et al., Nanometre-scale germanium photodetector enhanced by a near-infrared dipole antenna. *Nat. Photonics*. 2, 226-229 (2008).) The process started with a p-type (gallium doped) 4-inch bulk Ge wafer. A uniform $H^+$ layer was ion-implanted in the germanium wafer with a dose of $1×10^{17}$ $cm^{-2}$ and an energy of 100 KeV (shown in FIG. 6, panels (a)-(d)). An $H^+$ peak position (RP) was carefully designed at 700 nm from the Ge surface to acquire a 400-nm-thick Ge layer after the exfoliating process (panel (a)). A 1-µm-thick $SiO_2$ layer on an Si wafer was obtained by thermal oxidation of the buried oxide (BOX) layer. Then the Ge wafer was flipped over. The $O_2$ plasma was used to clean both surfaces for bonding (shown in panel (b)). The wafer bonding process was performed using the EVG Wafer Bonding System (EV 801) under the vacuum of $7×10^{-5}$ mbar (panel (c)). After that, a two-step, low temperature annealing at 200° C. and 250° C. was carried out in a nitrogen-filled oven to achieve the exfoliation of the Ge wafer (panel (d)). The Ge membrane was very rough after the exfoliation, and a Chemical Mechanical Polishing (CMP) process was used to polish the Ge membrane surface and thin down the Ge layer to the desired thickness (100 nm).

Figures 7A, 7B:
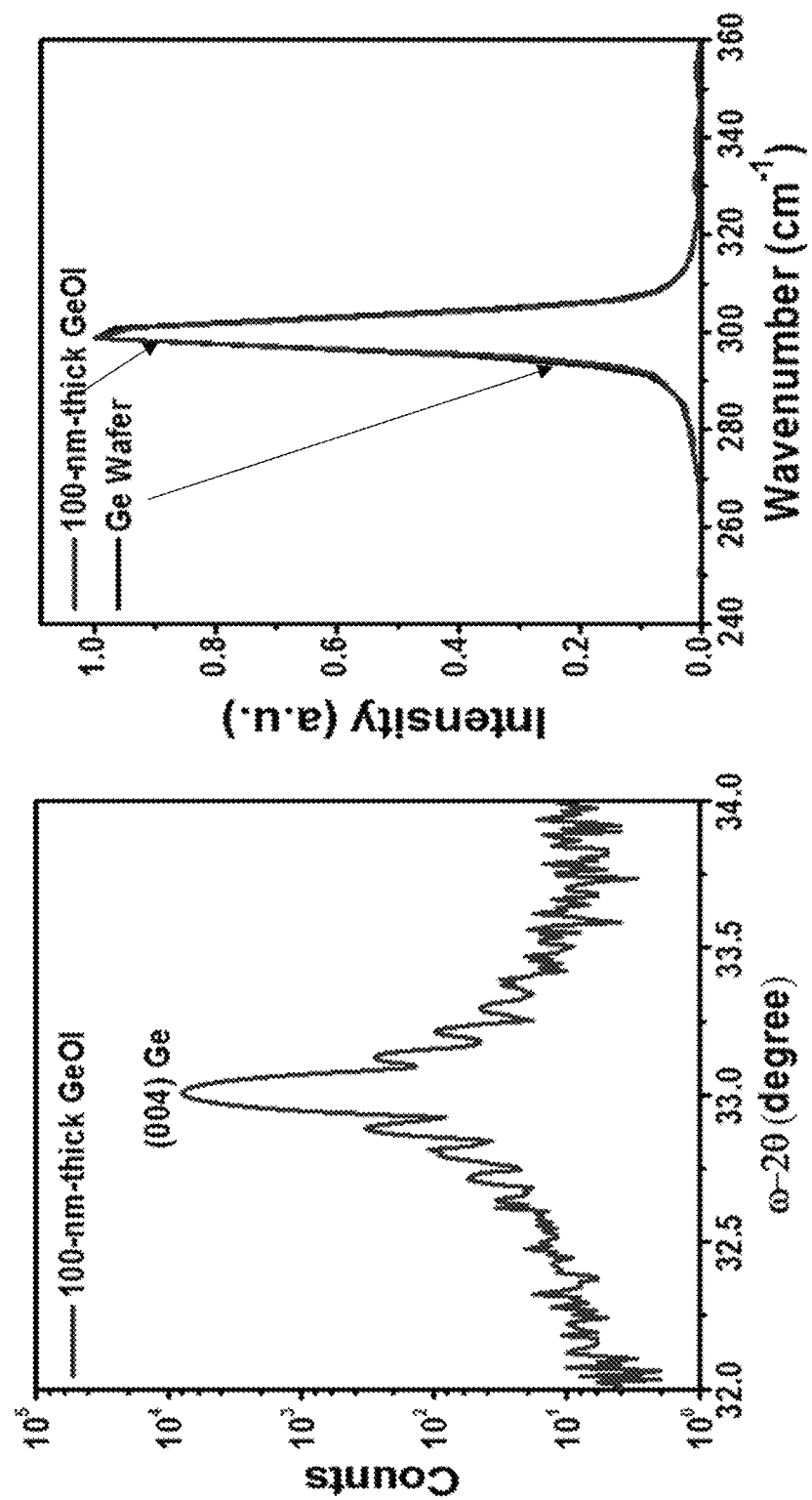
FIGS. 7A and 7B depict the characterization of a lab-made GeOI.
Figure 8B:
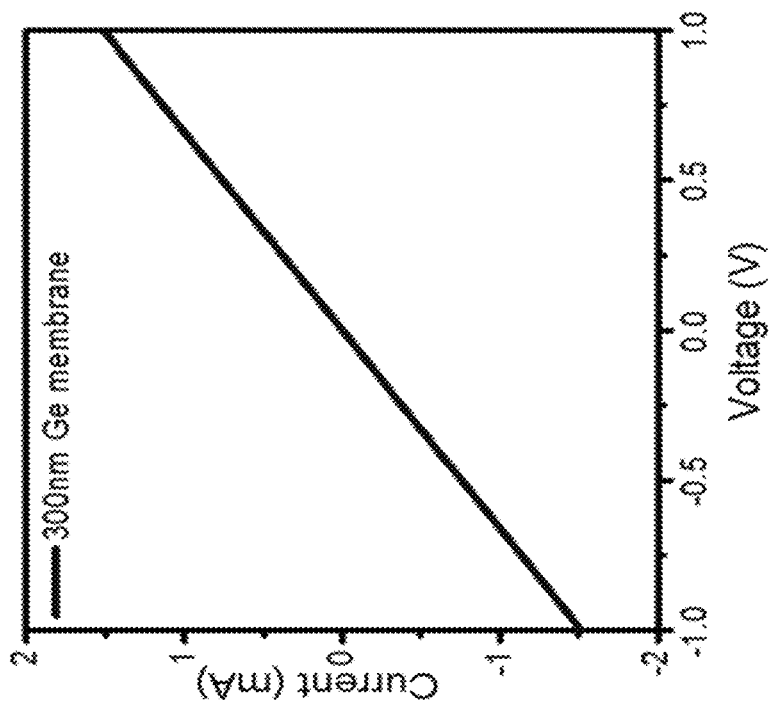
FIGS. 8A-8F depict dark current measurements for single-crystalline germanium films having different thicknesses.
Figure 8A:
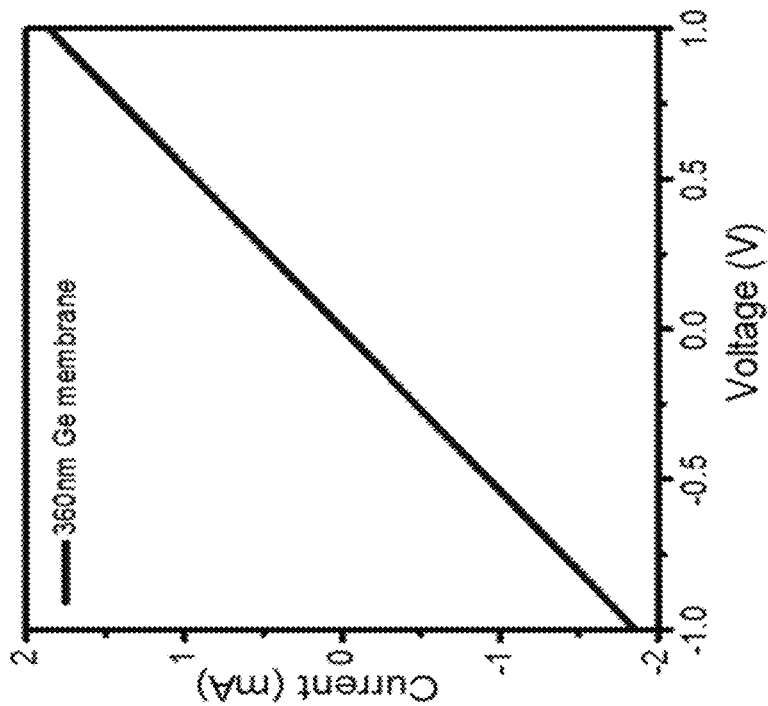
Figure 8C:
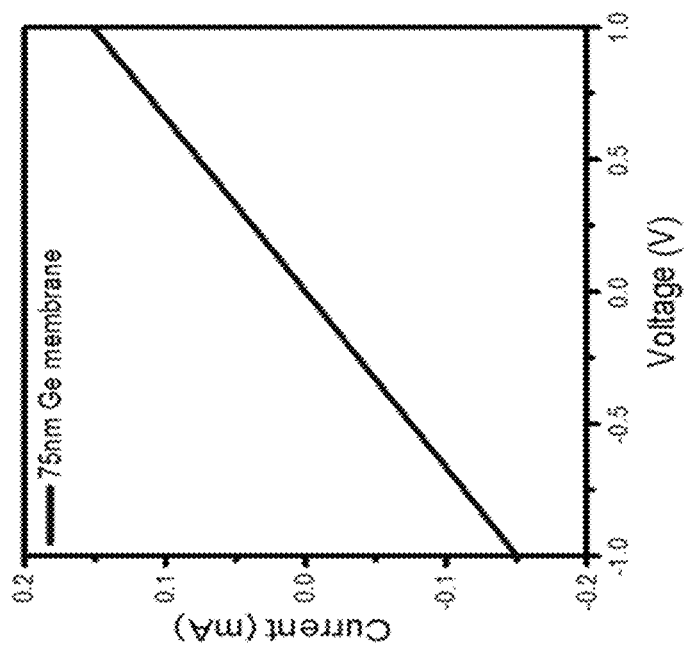
Figure 8D:
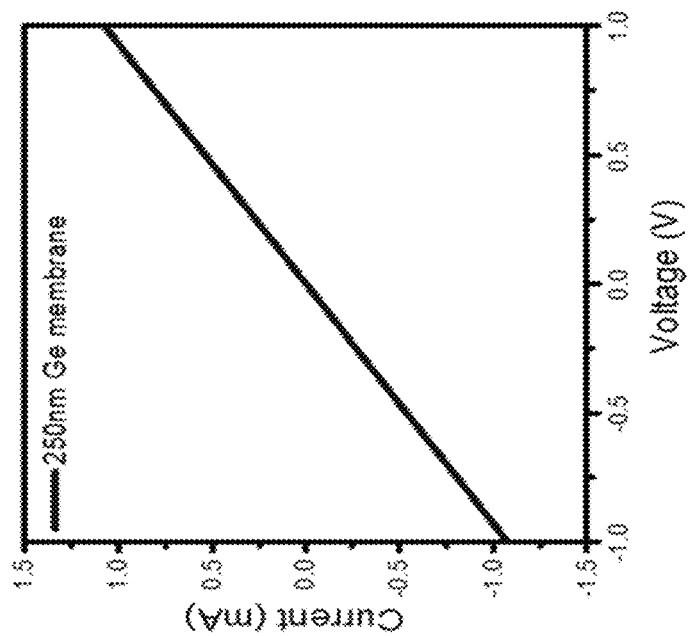
Figure 8F:
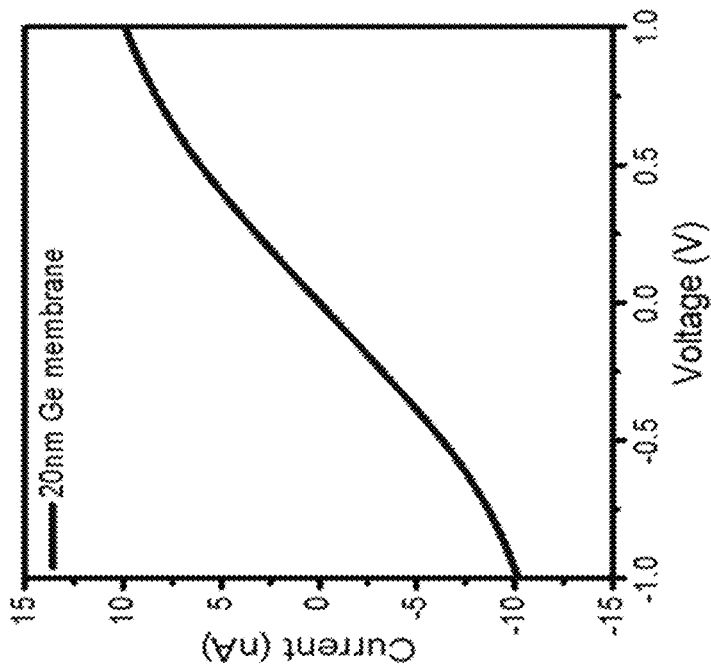
Figure 8E:
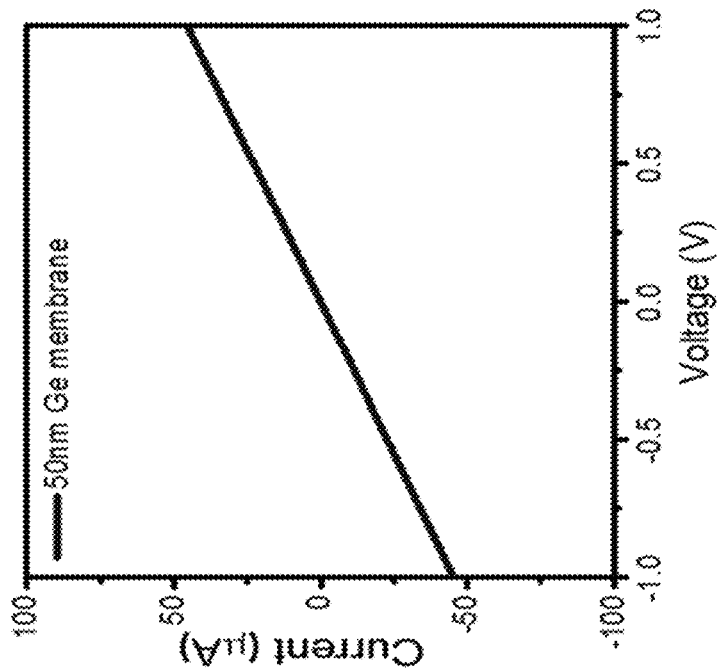

To characterize the lab-made GeOI, the Panalytical X'Pert MRD high resolution X-ray diffraction (XRD) was used to characterize the single crystallinity of the germanium membrane. FIG. 7A shows the XRD result of the GeOI with a peak at 33.1°, confirming the single crystallinity. The fringes on both sides of the peak were introduced by the X-ray interference with the 100-nm-thick Ge nanomembrane. The interference fringes indicated that both sides of the Ge nanomembrane were smooth and flat. The Horiba LabRAM ARAMIS Raman spectroscopy was also used to characterize the GeOI As shown by FIG. 7B, the fabricated GeOI had the same peak location of 300.9 $cm^{-1}$ as the Ge wafer, confirming that the fabricated GeOI was stress and strain free. The van der Pauw approach was then used to measure the carrier concentration and carrier mobility of the p-type GeOI, as shown in Table 1.

TABLE 1

| Electronic properties of p-type GeOI sample | |
|---|---|
| Parameter | P-Type GeOI |
| Sheet Resistance ($R_s$) | 617.7 Ω/□ |
| Hall Coefficient ($R_H$) | 97.9 $m^2$/C |
| Carrier Mobility ($\mu_p$) | 393 $cm^2$ $V^{-1}$ · $S^{-1}$ (hole) |
| Carrier Concentration | $1.447 × 10^{18}$/$cm^2$ |

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. An optoelectronic device comprising:
   an optical cavity comprising a reflector and a dielectric spacer overlying the reflector; and
   a single-crystalline inorganic semiconductor film having a thickness no greater than 100 nm in contact with the dielectric spacer at a non-epitaxial interface.

2. The device of claim 1, wherein the single-crystalline inorganic semiconductor film comprises a Group IV semiconductor, a Group II-VI semiconductor, or a Group III-V semiconductor.

3. The device of claim 1, wherein the single-crystalline inorganic semiconductor film comprises a 2D semiconductor.

4. The device of claim 3, wherein the 2D semiconductor is a transition metal dichalcogenide.

5. The device of claim 4, wherein the transition metal dichalcogenide is a tungsten dichalcogenide.

6. The device of claim 4, wherein the transition metal dichalcogenide is a transition metal selenide or a transition metal telluride.

7. The device of claim 1, wherein the single-crystalline inorganic semiconductor film has a thickness no greater than 50 nm.

8. The device of claim 1, wherein the single-crystalline inorganic semiconductor film has a thickness no greater than 20 nm.

9. The device of claim 1, wherein the single-crystalline inorganic semiconductor film is characterized in that it absorbs radiation with wavelengths in the visible region of the electromagnetic spectrum, the infrared region of the electromagnetic spectrum, or both.

10. The device of claim 2, wherein the single-crystalline inorganic semiconductor is a Group IV semiconductor.

11. The device of claim 10, wherein the Group IV semiconductor is Ge.

12. The device of claim 11, wherein the dielectric spacer comprises $Al_2O_3$.

13. The device of claim 1, wherein the dielectric spacer comprises $Al_2O_3$.

14. The device of claim 1, wherein the single-crystalline inorganic semiconductor film is a continuous film without patterned openings or islands.

15. A phototransistor comprising:
    an optical cavity comprising an electrically conductive reflector and a dielectric spacer overlying the reflector;
    a single-crystalline inorganic semiconductor film having a thickness no greater than 100 nm in contact with the dielectric spacer at a non-epitaxial interface;
    a source electrode; and
    a drain electrode, wherein the source electrode and the drain electrode are in electrical communication with the single-crystalline semiconductor film.

16. The phototransistor of claim 15, wherein the phototransistor has a normalized photocurrent-to-dark-current ratio of at least $1\times10^4$ $mW^{-1}$ under a bias of 1 V when illuminated with broadband radiation at an incident power of 40 nW.

17. The phototransistor of claim 15, wherein the phototransistor has a normalized photocurrent-to-dark-current ratio in the range from $1\times10^4$ $mW^{-1}$ to $1\times10^5$ $mW^{-1}$ under a bias of 1 V when illuminated with broadband radiation at an incident power of 40 nW.

18. The phototransistor of claim 16, wherein the single-crystalline inorganic semiconductor is germanium and the single-crystalline inorganic semiconductor film has a thickness no greater than 50 nm.

19. A method of detecting radiation using the phototransistor of claim 14, the method comprising:
    exposing the single-crystalline inorganic semiconductor film to the radiation, whereby charge carries are photogenerated and a drain current is modulated; and
    detecting the modulation of the drain current.

20. A device array comprising at least two optoelectronic devices, each of the at least two optoelectronic device comprising:
    an optical cavity comprising a reflector and a dielectric spacer overlying the reflector; and
    a single-crystalline inorganic semiconductor film having a thickness no greater than 100 nm in contact with the dielectric spacer at a non-epitaxial interface,
    wherein the at least two optoelectronic devices have different absorption spectra.

21. The device array of claim 20, wherein the single-crystalline inorganic semiconductor films in the at least two optoelectronic devices have different thicknesses.

* * * * *